(12) United States Patent
Kloster et al.

(10) Patent No.: US 7,294,934 B2
(45) Date of Patent: Nov. 13, 2007

(54) LOW-K DIELECTRIC STRUCTURE AND METHOD

(75) Inventors: Grant M. Kloster, Lake Oswego, OR (US); Xiarong Morrow, Portland, OR (US); Jihperng Leu, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 35 days.

(21) Appl. No.: 10/301,957

(22) Filed: Nov. 21, 2002

(65) Prior Publication Data

US 2004/0102031 A1  May 27, 2004

(51) Int. Cl.
*H01L 23/52* (2006.01)

(52) U.S. Cl. ............... 257/759; 257/775; 257/E23.145

(58) Field of Classification Search ................ 257/750, 257/758–760, 775, E23.145; 438/619, 622–624, 438/638

See application file for complete search history.

(56) References Cited

U.S. PATENT DOCUMENTS

| | | | |
|---|---|---|---|
| 5,923,074 A * | 7/1999 | Jeng ........................... | 257/522 |
| 6,100,184 A * | 8/2000 | Zhao et al. ................. | 438/638 |
| 6,165,890 A * | 12/2000 | Kohl et al. ................. | 438/619 |
| 6,413,852 B1 * | 7/2002 | Grill et al. .................. | 438/619 |
| 6,448,177 B1 | 9/2002 | Morrow et al. ............ | 438/638 |
| 6,555,467 B2 * | 4/2003 | Hsu et al. ................... | 438/633 |
| 6,867,125 B2 * | 3/2005 | Kloster et al. ............. | 438/618 |
| 2001/0030366 A1 * | 10/2001 | Nakano et al. ............ | 257/756 |
| 2002/0028575 A1 * | 3/2002 | Besling et al. ............. | 438/638 |
| 2002/0158337 A1 * | 10/2002 | Babich et al. ............. | 257/758 |
| 2003/0071355 A1 * | 4/2003 | Dubin et al. ............... | 257/751 |
| 2003/0111729 A1 * | 6/2003 | Leu et al. ................... | 257/758 |
| 2003/0186535 A1 * | 10/2003 | Wong et al. ............... | 438/637 |
| 2003/0203592 A1 * | 10/2003 | Kloster et al. ............. | 438/411 |
| 2003/0218253 A1 * | 11/2003 | Avanzino et al. .......... | 257/758 |
| 2004/0026786 A1 * | 2/2004 | Leu et al. ................... | 257/758 |
| 2004/0096592 A1 * | 5/2004 | Chebiam et al. ......... | 427/443.1 |
| 2004/0131829 A1 * | 7/2004 | Joseph et al. .............. | 428/166 |

OTHER PUBLICATIONS

Tetsuya Ueda et al., "A novel air gap integration scheme for multi-level interconnects using self-aligned via plugs", 1998 Symposium on VLSI Technology—Digest of Technical Papers, Jun. 9-11, 1998, IEEE, pp. 46-47.

Paul A. Kohl et al, "Air-gaps in 0.3 / spl mu / m electrical interconnections", IEEE Electron Device Letters, vol. 21, Issue 12, Dec. 2000, pp. 557-559.

* cited by examiner

*Primary Examiner*—Mary Wilczewski
*Assistant Examiner*—Toniae M Thomas
(74) *Attorney, Agent, or Firm*—David L. Guglielmi

(57) ABSTRACT

A low-k dielectric sacrificial material is formed within a microelectronic structure covered with a suitable porous or low density permeable material. At an appropriate time, the underlying sacrificial material is decomposed and diffused away through the overlying permeable material. As a result, at least one void is created, contributing to desirable dielectric characteristics.

13 Claims, 20 Drawing Sheets

LOW-K DIELECTRIC STRUCTURE AND METHOD

BACKGROUND OF THE INVENTION

Low dielectric constant materials are used as interlayer dielectrics in microelectronic devices, such as semiconductor devices, to reduce the RC delay and improve device performance. As device sizes continue to shrink, the dielectric constant of the material between metal lines must also decrease to maintain the improvement. Certain low-k materials have been proposed, including various carbon-containing materials such as organic polymers and carbon-doped oxides. The eventual limit for a dielectric constant is $k=1$, which is the value for a vacuum. Methods and structures have been proposed to incorporate void spaces or "air gaps" in attempts to obtain dielectric constants closer to $k=1$. One major issue facing air gap technology is how to remove sacrificial material to facilitate multi-layer structures. Another major issue facing air gap technology is how to facilitate air gap creation while providing a structure which can withstand modern processing steps, such as chemical-mechanical polishing and thermal treatment, as well as post processing mechanical and thermo-mechanical rigors.

Accordingly, there is a need for a microelectronic device structure incorporating air gaps which has low-k dielectric properties, can be used in multi-layer structures, and has acceptable mechanical characteristics during and after processing.

BRIEF DESCRIPTION OF THE DRAWINGS

The present invention is illustrated by way of example and is not limited in the figures of the accompanying drawings, in which like references indicate similar elements. Features shown in the drawings are not intended to be drawn to scale, nor are they intended to be shown in precise positional relationship.

DETAILED DESCRIPTION

In the following detailed description of embodiments of the invention, reference is made to the accompanying drawings in which like references indicate similar elements. The illustrative embodiments described herein are disclosed in sufficient detail to enable those skilled in the art to practice the invention. The following detailed description is therefore not to be taken in a limiting sense, and the scope of the invention is defined only by the appended claims.

This invention involves the integration of decomposable dielectric materials and permeable layers through which decomposed portions of the dielectric materials may be effectively diffused, leaving behind voids or air gaps associated with desirable dielectric qualities, as well as a permeable layer which may function as a geometrically efficient, low conductivity platform for subsequent layers in a multi-layer structure. The use of permeable layers in hard mask and via inter-layer dielectric positions may eliminate the need for other intermediate structural layers between air gap interconnect layers, due to the structural integrity of the permeable layer which remains intact during removal of sacrificial material and subsequent multi-layer construction. In this regard, the permeable layer functions somewhat like a multi-purpose scaffold to facilitate load bearing, diffusional transportation of sacrificial material, and dielectric insulation. The use of permeable layers as described herein may also eliminate lithographic steps or masks required by other air-gap dielectric processing techniques for removal of sacrificial materials, thereby streamlining process requirements. While three illustrative embodiments are depicted and described in detail, other variations and modifications will be apparent to those of ordinary skill in the art, and such variations and modifications are included within the intended scope of the invention.

Figure 1A:
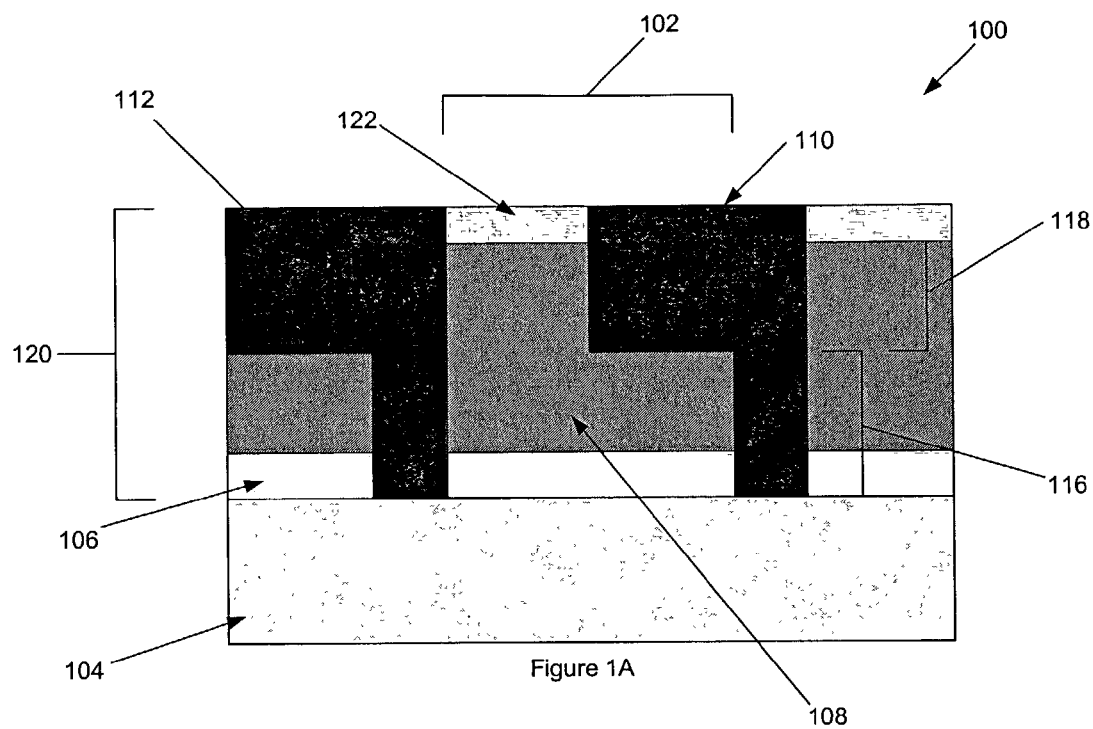
FIGS. 1A-1J depict cross-sectional views of various aspects of one embodiment of the present invention incorporating a permeable layer which functions as a hard mask.

FIG. 1A depicts a multi-layer microelectronic structure (100) comprising a substrate layer (104), a dielectric layer having etch selectivity and density such that it functions as a conventional "etch stop" layer, two conductive layers (110, 112), a permeable layer (122), and a sacrificial dielectric layer (108) positioned between the conductive layers (110, 112), and between the permeable layer and etch stop dielectric layer (106). The conductive layers (110, 112) are formed across both the permeable layer (122) and the sacrificial dielectric layer (108). The spacing between the conductive layers (110, 112) may vary with feature size of the microelectronic structure as would be apparent to one skilled in the art, and preferably is between about 10 nanometers and about 1,000 nanometers. The etch stop dielectric layer (106), sacrificial dielectric layer (108), conductive layers (110, 112), and permeable layer (122) are positioned substantially within planes occupied by the conductive layers (110, 112), which may be collectively known as the "interconnect layer" (120). The depicted conductive layers each comprise a line portion (118) and a via portion (116), as is common conductive layer cross sectional geometry in some interconnect structures.

Figure 1B:
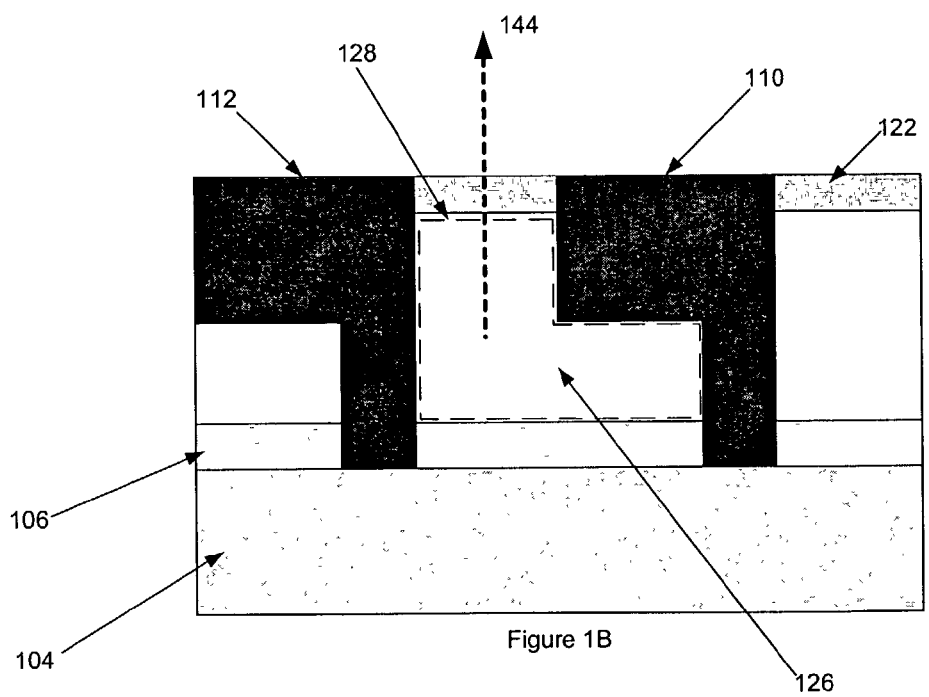

FIG. 1B shows a variation of the structure of FIG. 1A having similar substrate (104) and interconnect (120) layers, with the exception that a transformation has occurred at the position previously occupied by the sacrificial dielectric layer (108) of FIG. 1A. A portion of the sacrificial dielectric layer has been "remotely decomposed", or decomposed as other surrounding layers are left substantially intact, to produce a sacrificial dielectric layer decomposition (not shown), which has been removed by diffusion along a diffusion pathway (144) through the permeable layer (122). The resulting microelectronic structure, shown in FIG. 1B, comprises one or more voids (126) in the volume (128) previously occupied by the intact sacrificial dielectric layer, the voids (126) preferably occupying more than about 70% of the volume (128) previously occupied by the intact sacrificial dielectric layer. The variation depicted in FIG. 1B may be referred to as the "transformed" version of the structure of FIG. 1A. This transformed structure may have more preferable dielectric properties than the intact structure, and continues to have the structural benefit of the other surrounding layers, which remain intact and can contribute to a resistance of forces which may be subsequently applied during treatments such as chemical mechanical polishing ("CMP").

In the variation of FIGS. 1A and 1B, the permeable layer (122) is positioned to protect dielectric layers between it and a substrate (104) not only from mechanical loads, but also from environmental factors such as chemicals used to remove subsequent materials, such as lithography patterning materials. The position occupied by the permeable layer in FIGS. 1A and 1B may be referred to as the position often occupied by a "hard mask" layer, which typically has such a protective functionality for layers between it and the substrate layer (104), as would be apparent to those skilled in the art. Specifically, the depicted variation comprises a permeable layer (122) in the position of a hard mask which is disposed adjacent both the sacrificial layer (108) and the conductive layers (110, 112) in a manner wherein the top surface of the permeable layer (122) hard mask is positioned substantially within the same plane as the top surface of the conductive layers (110, 112).

The material comprising the permeable layer (122) in the hard mask position is selected for its ability to withstand and facilitate both remote decomposition of a portion of the material comprising the sacrificial dielectric layer (108), to produce a sacrificial dielectric layer decomposition, and removal of the sacrificial dielectric layer decomposition through the permeable layer (122), by diffusion, without substantially affecting the mechanical integrity of the permeable layer (122) or other layers which surround the sacrificial dielectric layer. The material comprising the sacrificial dielectric layer (108) is selected for its ability to not only perform as a low-conductance dielectric material, but also for its ability to be remotely decomposed and removed through the permeable layer (122) with which it is matched, by diffusion.

Suitable materials for the sacrificial dielectric layer (108) include but are not limited to polynorbornene-based polymers, such as that sold under the trade name "Unity400™", distributed by Promerus LLC; polycyclohexene; the co-polymer of polypropylene oxide and polyethylene oxide; polystyrene; poly(p-phenylene); polyxylene; cross-linked polymethylmethacrylate ("PMMA"); polyarylene-based polymeric dielectrics such as that sold under the trade name "SiLK™", distributed by Dow Chemical Corporation; poly(aryl ether)-based polymeric dielectrics such as that sold under the trade name "FLARE™", distributed by Honeywell Corporation; and polyarylene-based spin-on dielectrics such as that sold under the trade name "GX-3™", also from Honeywell Corporation. Depending upon the material selected for this and other associated layers, such as the conductive layers (110, 112), the sacrificial dielectric layer (108) maybe deposited using conventional techniques, such as spin-on, chemical vapor deposition ("CVD"), plasma-enhanced chemical vapor deposition ("PECVD"), evaporative deposition, or physical vapor deposition ("PVD") to form a layer preferably having a thickness between about 200 nanometers and about 1,500 nanometers. In the case of spin-on or other deposition techniques, solvent may need to be removed by evaporative techniques familiar to those skilled in the art.

Suitable materials for the permeable layer (122) include but are not limited to silicon dioxide; silicon nitride; silicon carbide; aluminum oxide; aluminum phosphate; boron nitride; porous materials known as "zeolites", such as highly-ordered mesoporous silica and aluminosilicate; a siloxane-based polymer sold under the trade name "LKD-5109™", distributed by JSR Microelectronics Corporation, which may be formed into porous layers; fluorinated silicate glass ("FSG"); porous and nonporous carbon doped oxide ("CDO"), having the molecular structure $Si_x O_y R_z$, in which "R" is an alkyl or aryl group, the CDO preferably comprising between about 5 and about 50 atom % carbon, and more preferably, about 15 atom % carbon; a CVD-deposited CDO sold under the trade name "Black Diamond™", distributed by Applied Materials Corporation; siloxane-based polymers, such as those sold under the trade names "Nanoglass E™" and "Zirkon™", distributed by Honeywell Corporation and Shipley Corporation, respectively; a spin-on low-k silicon dioxide variant sold under the trade name "FOx™" distributed by Dow Corning Corporation; a CVD-deposited CDO sold under the trade name "Coral™", distributed by Novellus Corporation; and electron-beam-cured CVD-deposited CDO materials. It is generally desirable that layers positioned for hard mask functionality have as small a thickness as possible while still allowing for reliable etching. Depending upon the etchants and materials selected for the permeable layer (122) and other associated layers, such as the conductive layers (110, 112), the permeable layer (122) may be deposited using conventional techniques, such as spin-on, CVD, PECVD, evaporative deposition, or PVD to form a layer having a thickness preferably between about 10 nanometers and about 200 nanometers. Zeolite materials may be synthesized by an aerogel or xerogel process, spin-coated into place, or deposited using CVD to form a voided structure upon deposition.

The modality for remote decomposition and removal of sacrificial material without substantial effect upon the permeable material varies with the materials selected. In one embodiment, sacrificial material comprising the sacrificial dielectric layer (108) may be selectively decomposed and removed through the permeable layer (122) on the basis of differences in thermal decomposition temperatures between the sacrificial material and other surrounding materials. For example, several of the aforementioned suitable sacrificial materials, such as polynorbornene, polypropylene oxide—polyethylene oxide copolymer, polystyrene, and cross-linked PMMA may be thermally decomposed at temperatures not substantially effecting surrounding structures comprising materials such as silicon dioxide, silicon nitride, carbon doped oxide, and mesoporous silica, and aluminosilicate. A pairing of a sacrificial material having a relatively low thermal decomposition threshold may contribute to selective removal of thermally decomposed sacrificial material, or sacrificial material "decomposition", as facilitated or induced, for example, by introduction of an oxygen or hydrogen rich carrier plasma to carry away the decomposition, as is known to those skilled in the art as a standard plasma enhanced carrier technique. Thermally decomposing the sacrificial material may be accomplished using conventional equipment, such as a furnace or oven. Depending upon the materials selected, plasma tools may be appropriate as well, as would be apparent to one skilled in the art.

Many of the aforementioned suitable sacrificial materials also may be selectively chemically decomposed without substantial decomposition of the aforementioned preferred permeable layer (122) materials using chemical solvents and agents, such as propylene glycol monomethyl ether acetate, a versatile solvent used in many applications, cyclohexanone, a ketone solvent, ketenes such as 1-ene-3-cyclohexanone, hydrogen peroxide, tert-butyl peroxide, and solutions containing the cerium(IV) ion. In other words, sacrificial dielectric materials susceptible to a chemically decomposing agent may be paired with permeable layers comprising materials upon which such chemically decomposing agent is substantially ineffective for selective chemical decomposition. Polymeric sacrificial materials may need functionalization with polar groups such as hydroxy or alkoxy groups for solvent compatibility with the selected solvent or agent, as is convention to those skilled in the art. To clarify the simplified terminology used herein as associated with the thermal or chemical break-down of sacrificial materials for subsequent removal, references to "decompositions" and "decomposing" comprise references to "dissolving" and "dissolution" as well, or more simply, "break-down" by thermal or chemical means.

Once a sacrificial dielectric layer decomposition has been formed by heating at least a portion of the sacrificial dielectric material to the appropriate decomposition temperature or introducing the appropriate chemical agents, the decomposition is removed by diffusion along a pathway (144) through the permeable layer (123). Gases comprising broken down, decomposed, or dissolved sacrificial materials may be diffused through solid materials at rates in the range of $1 \times 10^{-8}$ to $1 \times 10^{-10}$ cubic centimeters per second, and may be diffused through porous materials even faster, such as rates between $1 \times 10^{-5}$ to $1 \times 10^{-6}$ cubic centimeters per second or faster, depending upon the size of the pores or voids. Diffusion of gases into porous oxide and other materials have been demonstrated in related technologies and structures, such as with CVD barrier deposition, plasma treatments, and resist poisoning after etching. Given the suitable materials and ranges of preferred dimensions for the various structures, gases comprising broken down, decomposed, or dissolved sacrificial materials may be diffused away and removed from an interconnect position within a time between about 20 second and 300 seconds.

Diffusion may occur as a byproduct of the decomposition process, such as the scenario wherein gases carrying portions of the sacrificial material decomposition may be exhausted away from the permeable layer (123) given an available lower gradient pathway, or may occur as facilitated or induced by introduction of reactive carriers to the area of the decomposition. Preferred reactive carriers include carrier plasmas such as oxygen and hydrogen rich plasmas, which are known to actively absorb and transport materials or portions thereof due to the high reactivity of oxygen and plasma. Chemical cleaning or etching agents, such as supercritical carbon dioxide, which are also known to absorb and transport decomposed materials, may also be used to remove sacrificial material decompositions. Both the plasma and supercritical carbon dioxide decomposition modalities require special process equipment and environments, as is convention to those skilled in the art.

Given the variety of suitable materials, many pairings of permeable layer and sacrificial material may be successfully paired for selective decomposition and removal, depending upon the mode of decomposition, surrounding materials, and environmental limitations. Thermal and chemical modalities for facilitating selective decomposition and removal of sacrificial materials are preferred, in part because precise thermal and chemical treatments are convention in microelectronic device processing. In a preferred thermal transformation embodiment, the material comprising the permeable layer (122) has a higher thermal decomposition temperature, in addition to a high glass transition temperature for thermo-mechanical stability. With such a pairing, the sacrificial dielectric layer (108), or a portion thereof, may be heated to a temperature above the thermal decomposition temperature for the sacrificial material which is below the thermal decomposition temperature for the permeable layer (122) and other surrounding structures, to facilitate removal of the sacrificial material decomposition before subsequent cooling. In a preferred chemical transformation embodiment, chemically-enhanced decomposition of the selected sacrificial material results is substantially no decomposition of the associated permeable layer material or other adjacent materials.

Preferred pairings of permeable and sacrificial materials, for example, include but are not limited to: a polynorbornene-based polymer dielectric sacrificial material with a silicon dioxide permeable layer, wherein the polynorbornene-based polymer dielectric material is thermally decomposed at a temperature of between about 400 and about 425 degrees Celsius, without thermally decomposing the silicon dioxide permeable layer, which has a thermal decomposition temperature over 500 degrees Celsius; a polycyclohexene-based polymer dielectric sacrificial material with a silicon nitride permeable layer, wherein the polycyclohexene-based polymer dielectric material is thermally decomposed at a temperature of between about 400 and about 425 degrees Celsius, without thermally decomposing the silicon nitride permeable layer, which has a thermal decomposition temperature over 500 degrees Celsius; a polystyrene sacrificial dielectric material with a mesoporous aluminosilicate permeable layer, wherein the polystyrene sacrificial dielectric material is thermally decomposed at a temperature of between about 400 and about 425 degrees Celsius, without thermally decomposing the mesoporous aluminosilicate permeable layer, which has a thermal decomposition temperature over 500 degrees Celsius.

The substrate (104) may be any surface generated when making an integrated circuit, upon which a conductive layer may be formed. Substrate (104) thus may comprise, for example, active and passive devices that are formed on a silicon wafer, such as transistors, capacitors, resistors, diffused junctions, gate electrodes, local interconnects, etcetera. Substrate (104) may also comprise insulating materials (e.g., silicon dioxide, either undoped or doped with phosphorus or boron and phosphorus; silicon nitride; silicon oxynitride; or a polymer) that separate active and passive devices from the conductive layer or layers that are formed adjacent them, and may comprise other previously formed conductive layers.

The structures, methods, and materials associated with the illustrated embodiments of FIGS. 1A and 1B are further described in the multiple-layer example depicted in FIGS. 1C-1J which builds upon the structure depicted in FIG. 1B using similar layers and materials, and thus serves to not only further describe single-interconnect-layer methods and structures such as those depicted in FIGS. 1A and 1B, but also to describe how such embodiments may be integrated into more complex multi-layer embodiments of the invention, with previously formed permeable layers functioning as mechanical platforms to enable formation of subsequent layers in close proximity to voids resulting from removed sacrificial materials without mechanical failure.

Figure 1C:
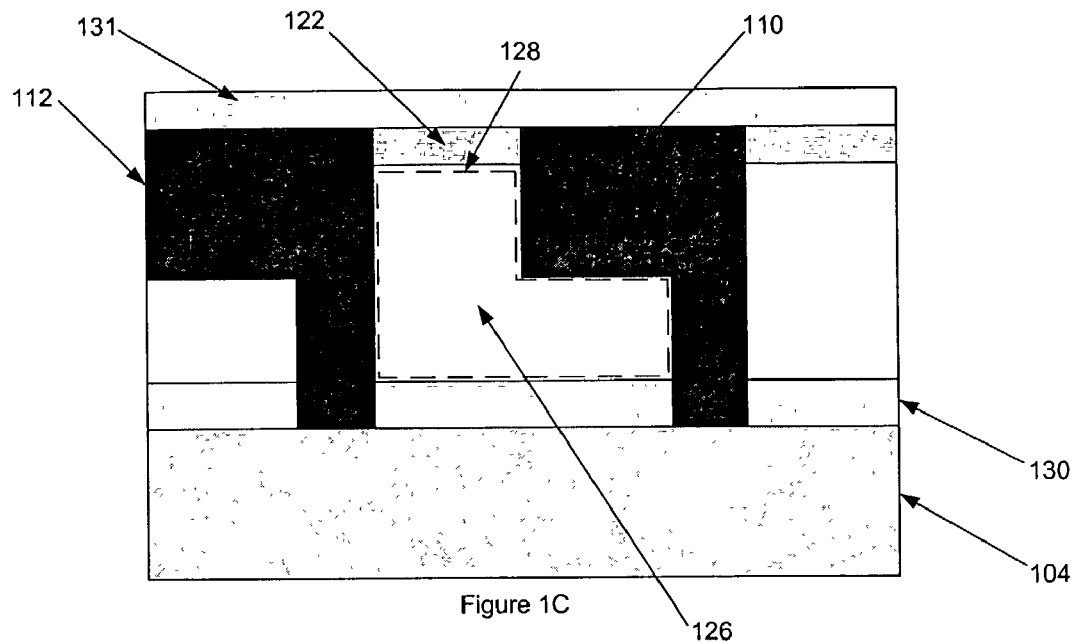
Figure 1D:
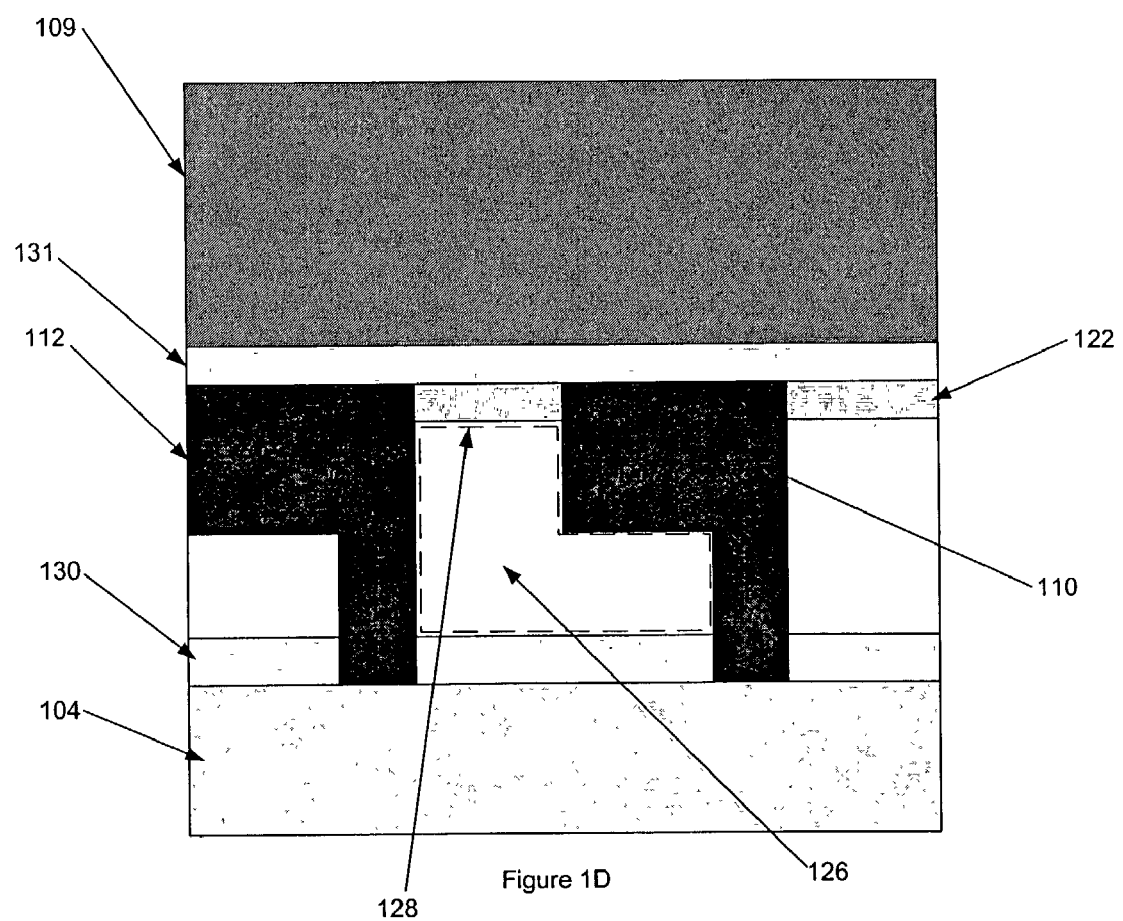

Referring to FIG. 1C, an additional etch stop dielectric layer (131) has been added to the structure depicted in FIG. 1B. FIG. 1D depicts the microelectronic structure of FIG. 1C with another sacrificial dielectric layer (109) added adjacent the etch stop dielectric layer (131). The etch stop dielectric layer (131) preferably comprises a material, such as silicon nitride other known etch stop material appropriately matched with the etchability of adjacent layers, which selectively does not substantially etch when the layer above (109) is being etched. The etch stop dielectric layer (131) is deposited using conventional chemical vapor deposition ("CVD"), plasma enhanced CVD, or low-pressure CVD techniques, as are well known in the art, at a thickness preferably between about 10 nanometers and about 200 nanometers. The sacrificial dielectric layer may comprise a material similar to that which comprises the sacrificial dielectric layer (108) depicted in FIG. 1A, such as the aforementioned polymeric dielectric materials, and may be deposited using conventional deposition techniques such as spin-on for suitable polymers, conventional CVD, or physical vapor deposition ("PVD"), at a thickness depending upon the conductive layer material chosen, preferably between 200 nanometers and 1,500 nanometers.

Figure 1E:
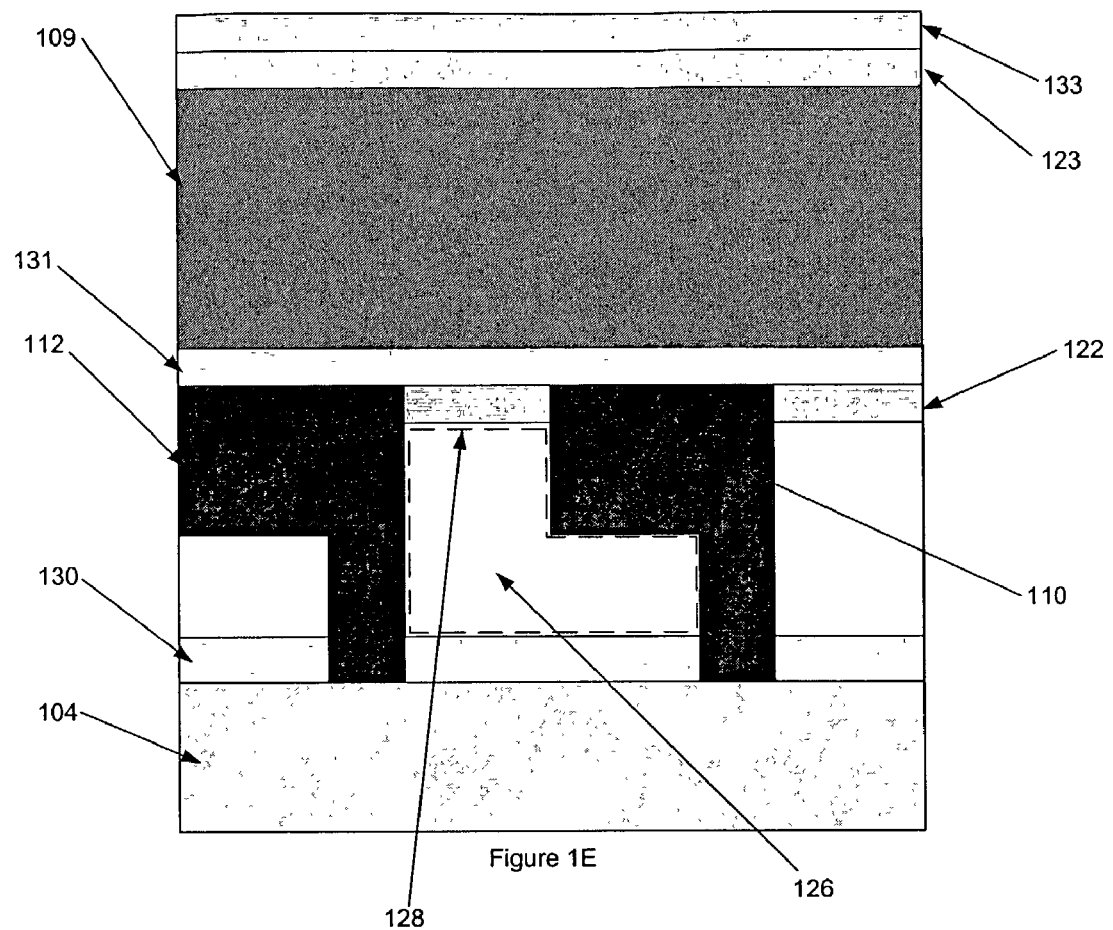

Referring to FIG. 1E, a microelectronic structure similar to that of FIG. 1D is depicted, the structure of FIG. 1E having two additional layers deposited adjacent the sacrificial dielectric layer (109), the two additional layers comprising an additional permeable dielectric layer (123), and an additional etch stop dielectric layer (133). Each of these layers may comprise a similar material and be formed in a similar manner to that with which the predecessor similar layers (122, 131) were formed, such as by conventional CVD or spin-on techniques.

Figure 1F:
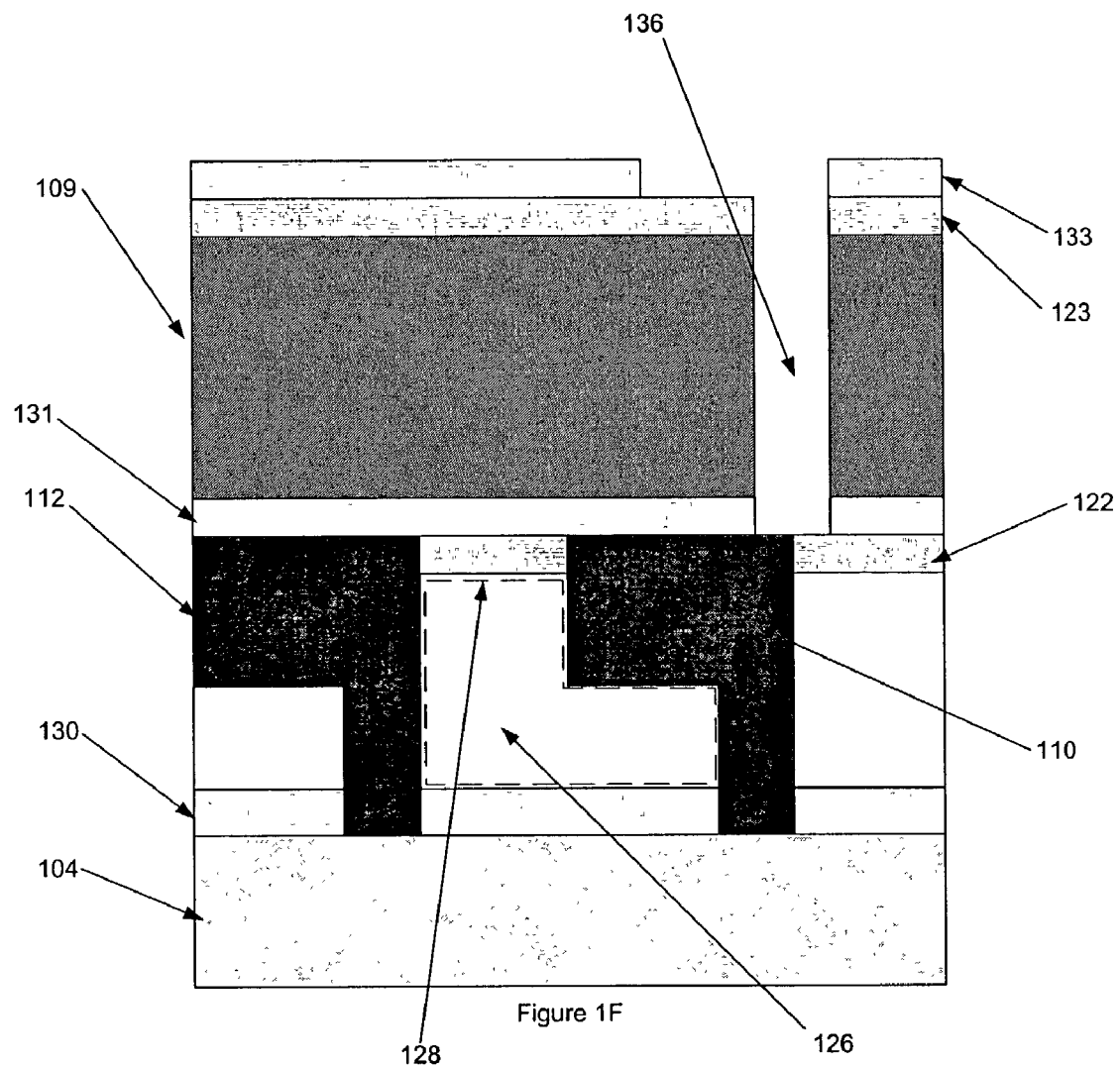
Figure 1G:
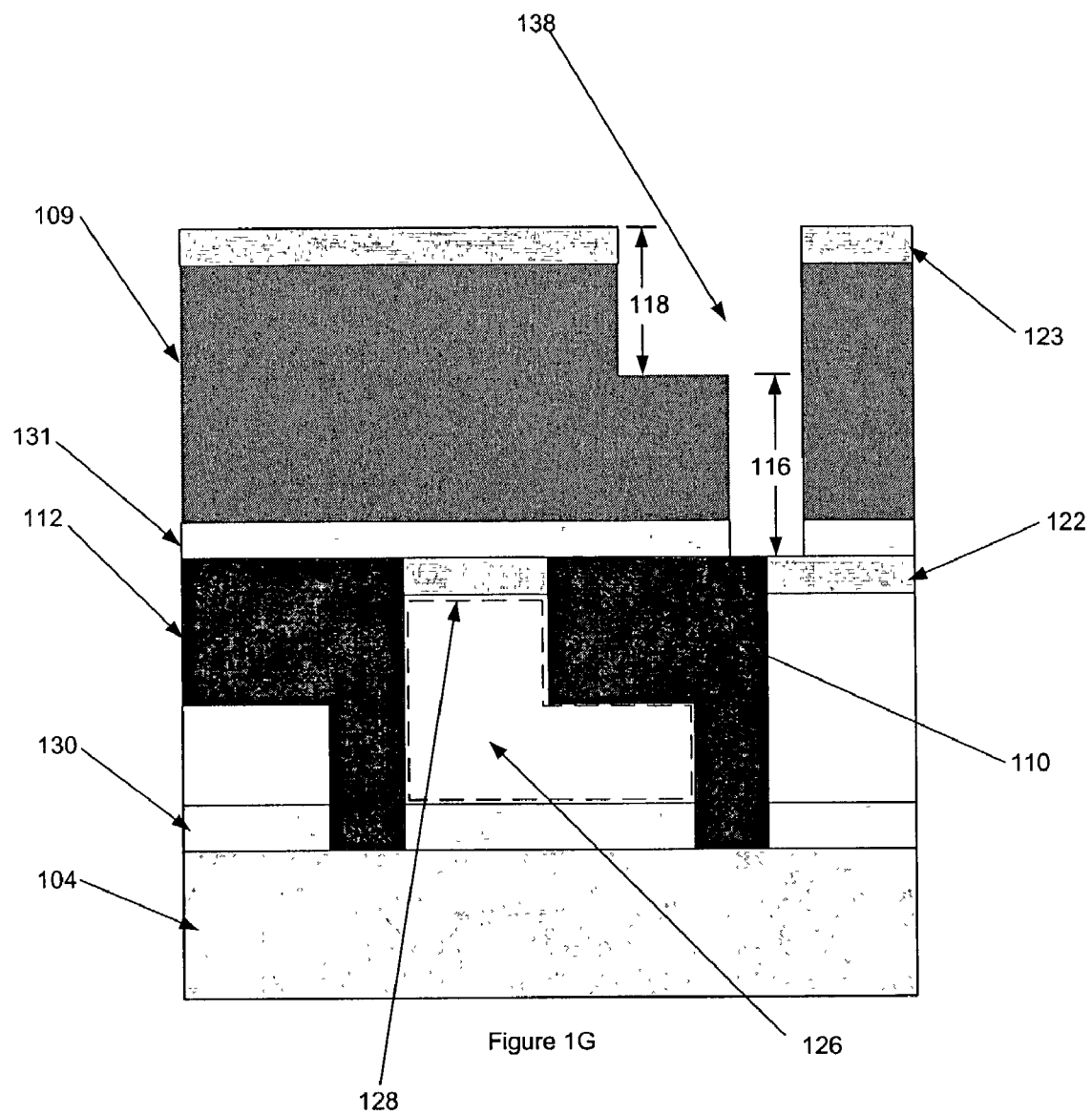

Referring to FIG. 1F, a trench (136) is shown across the uppermost etch stop layer (133), the adjacent permeable layer (123), and the sacrificial dielectric layer (109) in an orientation substantially perpendicular to the plane of the substrate layer, as is typical convention. The trench (136) is formed using conventional lithography patterning and etching techniques, in which the etching may be plasma-enhanced dry etching, or wet etching using liquid etchants. FIG. 1G shows an expanded trench, formed using similar conventional lithography patterning and etching techniques, subsequent to removal of the uppermost etch stop layer (133 in FIG. 1F) using known techniques such as plasma ashing or CMP. The resultant enlarged trench (138), having a width preferably between about 10 nanometers and about 1,000 nanometers depending upon the materials selected for the conductive layers and other associated structures, may then be coated with a barrier layer (not shown) as appropriate given the selected conductive material. For example, in the case of a copper, a preferred conductive material which may react adversely with adjacent dielectric materials and devices, a barrier layer may be formed to block diffusion of copper or other conductive layer elements into adjacent layers of dielectric material. Preferable barrier layer materials for copper conductive layers comprise refractory materials such as tantalum, tantalum nitride, and titanium nitride, or other materials that can inhibit diffusion from conductive layers into dielectric layers. Such barrier layers preferably are between about 10 and 50 nanometers thick, and preferably are formed using a conformal CVD process. Known polymeric barrier layers may also be employed, subject to the requirement that they be selected from the subgroup of polymer barrier materials which have relatively good electromigration characteristics.

Figure 1H:
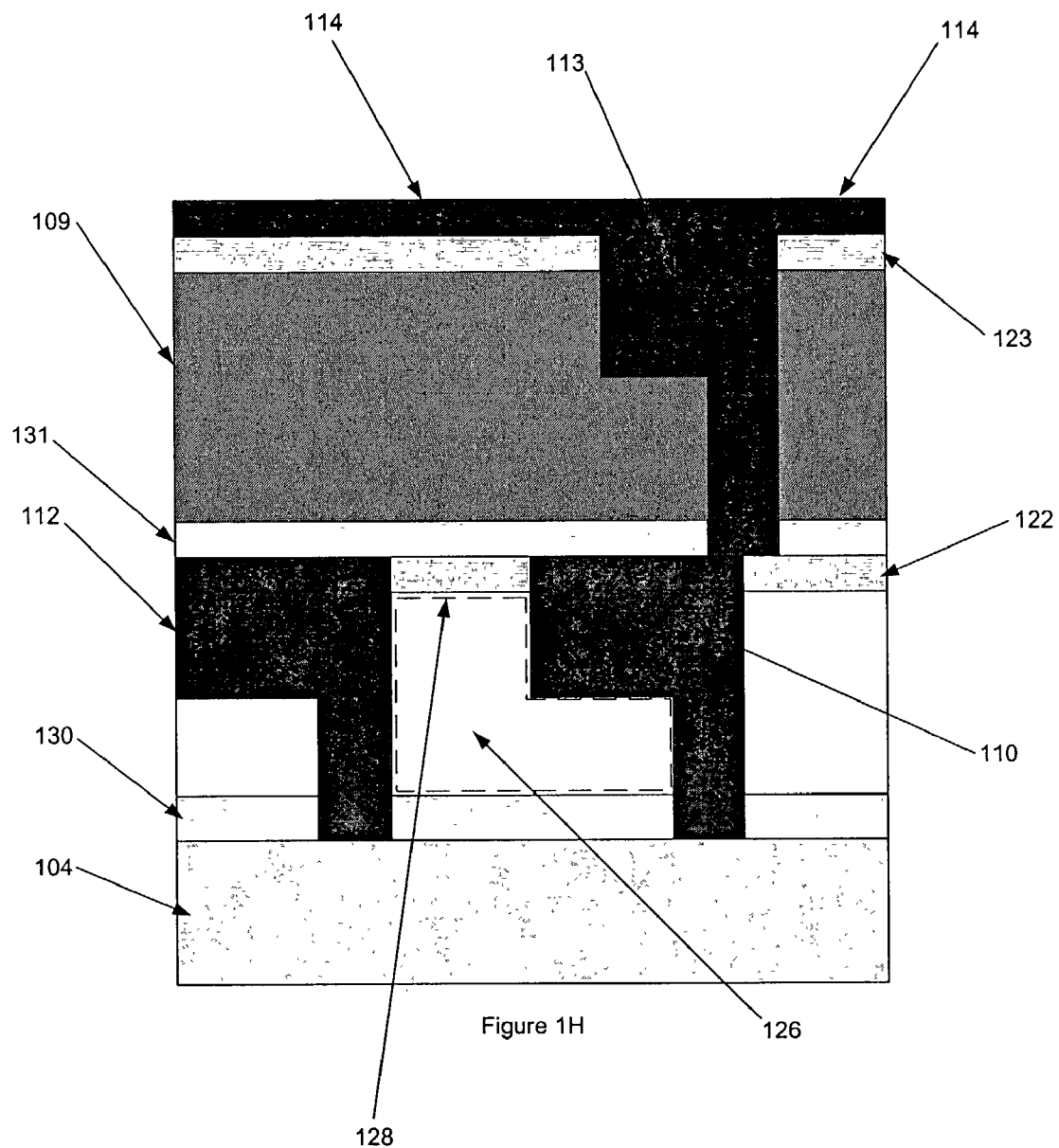

Referring to FIG. 1H, a conductive layer (113) is formed into the geometry defined by the enlarged trench (138) depicted in FIG. 1G. The conductive layer (113) comprises material conventionally used to form conductive layers in integrated circuits, and preferably comprises metals such as copper, aluminum, and alloys thereof, formed using known techniques such as electroplating or CVD, or PVD.

For example, the depicted conductive layer (113) may be formed using dual damascene techniques, wherein a trench filled with a conductive material using, for example, known electroplating, chemical vapor deposition, or physical deposition techniques. As a result of the deposition process, the trench may be overfilled with conductive material, resulting in extra conductive material outside of the trench (114), as depicted in FIG. 1H. Copper is a preferred conductive material, and copper dual damascene processing, generally comprising adding a barrier layer for isolation purposes before electroplating, as discussed above, is known convention in the art. Alternatively, a conductive layer (113) may be made from doped polysilicon or a silicide, e.g., a silicide comprising tungsten, titanium, nickel, or cobalt, using known techniques. The resultant conductive layer (113) is formed across both the permeable layer (123) and the sacrificial dielectric layer (109).

It is important to note that while a damascene type process is illustrated, wherein the conductive layer is formed into trenches using electroplating techniques, the dielectric aspects of the invention, illustrated in summary fashion with the transformation from structures like that of FIGS. 1A, 1I, 2A, 3C, and 3L to structures like those of FIGS. 1B, 1J, 2B, 3D, and 3M, respectively, may be similarly applied to structures formed using other conventional techniques for forming conductive layers, such as subtractive metallization, given that the appropriate materials are in place as further described herein. As would be apparent to one skilled in the art, subtractive metallization may involve formation of adjacent dielectric layers after formation of conductive layers, and the geometries of conductive layers formed may vary from those available with electroplating processes such as dual damascene.

Figure 1I:
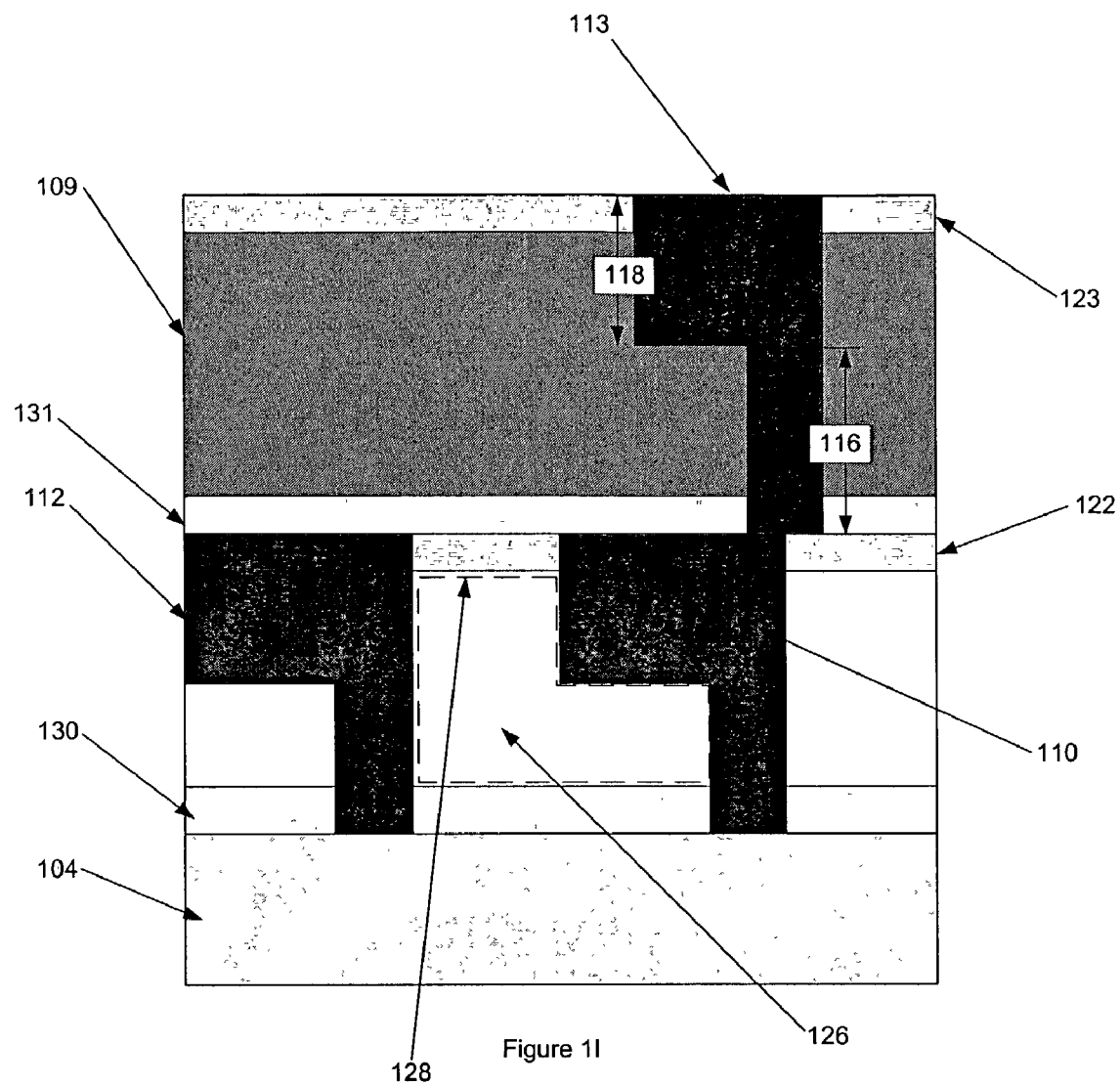

Referring to FIG. 1I, the extra conductive material outside of the trench (114) previously seen in FIG. 1G has been removed, preferably by chemical mechanical polishing of the extra material until substantially none remains and the conductive layer is refined to compose a line portion (118) and a via portion (116), the line portion (118) having a top surface which is substantially within the same plane as the top surface of the adjacent permeable layer (123), as shown in FIG. 1I. Since, for illustrative purposes, the modifications, materials, and processes depicted in FIGS. 1C-1I and described herein have paralleled those used to develop the structures of FIGS. 1A and 1B, the top portion of the structure depicted in FIG. 1I looks very similar to the structure of FIG. 1A, in that it has a sacrificial dielectric layer (109), between a permeable layer (123) positioned as a hard mask, and an etch stop dielectric layer (131), with a conductive layer crossing portions of the permeable (123), sacrificial dielectric (109), and etch stop (131) layers.

Figure 1J:
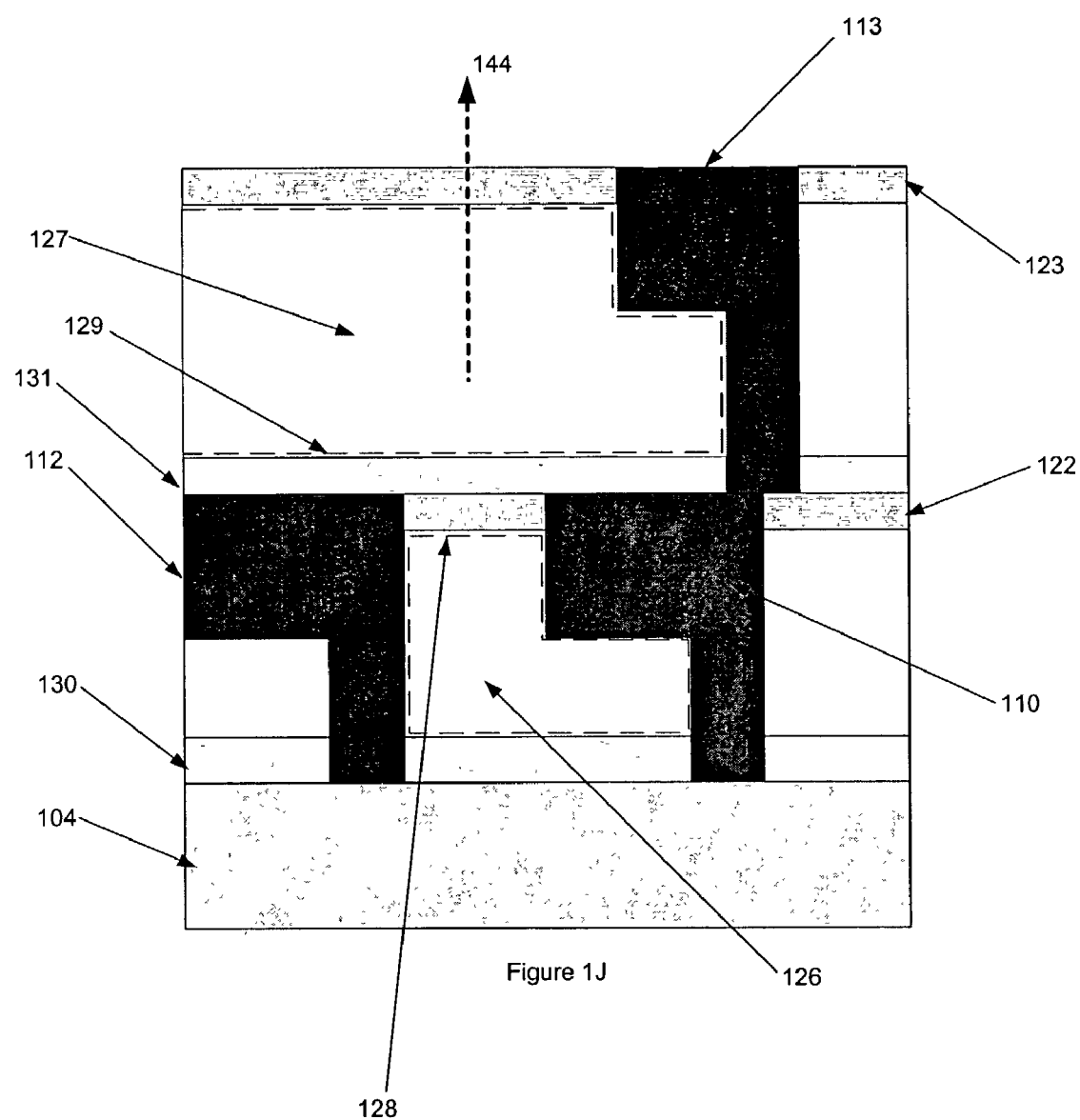

Referring to FIG. 1J, and following the description in reference to the parallel structure of FIG. 1B, the sacrificial dielectric material has been remotely decomposed using thermal or chemical techniques, and removed by diffusion (144) through the permeable layer (123), leaving behind a dielectric layer having one or more voids (127) in the volume (129) previously occupied by the intact sacrificial dielectric layer (109) of FIG. 1J, the voids (127) preferably occupying more than about 70% of the volume previously occupied by the intact sacrificial dielectric layer (109).

Depending upon the selected conductive material, a shunt layer (not shown) may be subsequently formed over the conductive layer (113) using conventional techniques and materials, to isolate the conductive layer from subsequent treatments and materials. With copper metal conductive layers, a metal shunt layer comprising, for example, cobalt or tungsten, is effective for isolating the copper. The shunt material (not shown) preferably is deposited using conventional selective techniques such as electroless or flash deposition, at a thickness preferably between about 5 nanometers and about 100 nanometers. Deposition of the shunt material may follow a planarization using known techniques such as chemical-mechanical planarization. As would be apparent to one skilled in the art, the selectivity of the preferred shunt deposition procedures generally obviates the need for additional planarization or etch back to remove shunt material from dielectric materials adjacent the conductive layers.

Figure 2A:
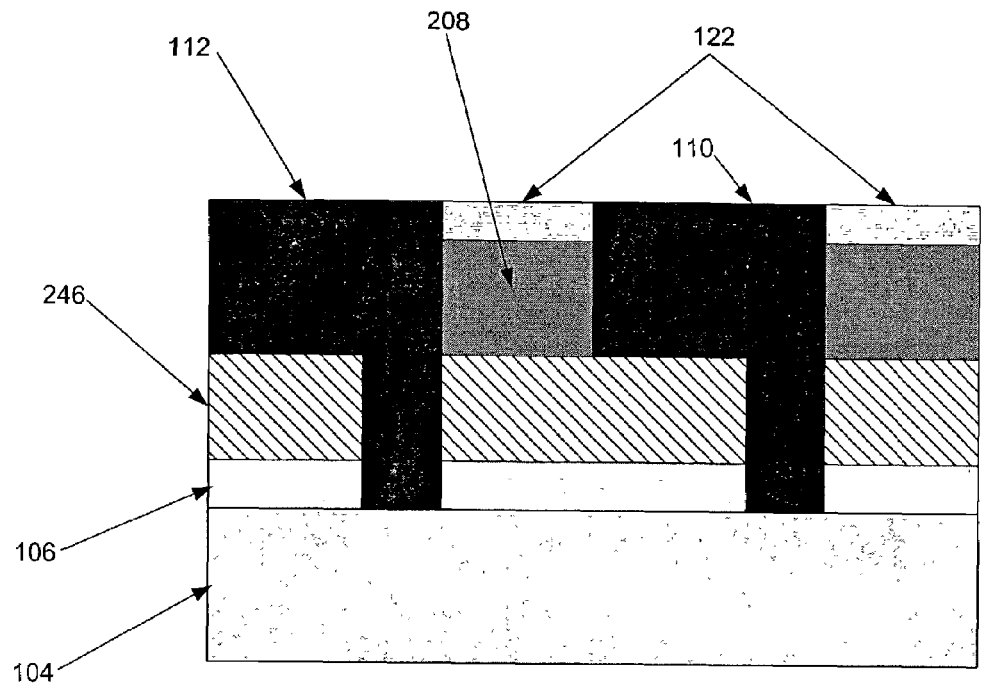
FIGS. 2A-2B depict two cross sectional views of another embodiment of the present invention incorporating a permeable layer which functions as a hard mask, and an additional dielectric layer between the sacrificial dielectric layer and the substrate layer.
Figure 2B:
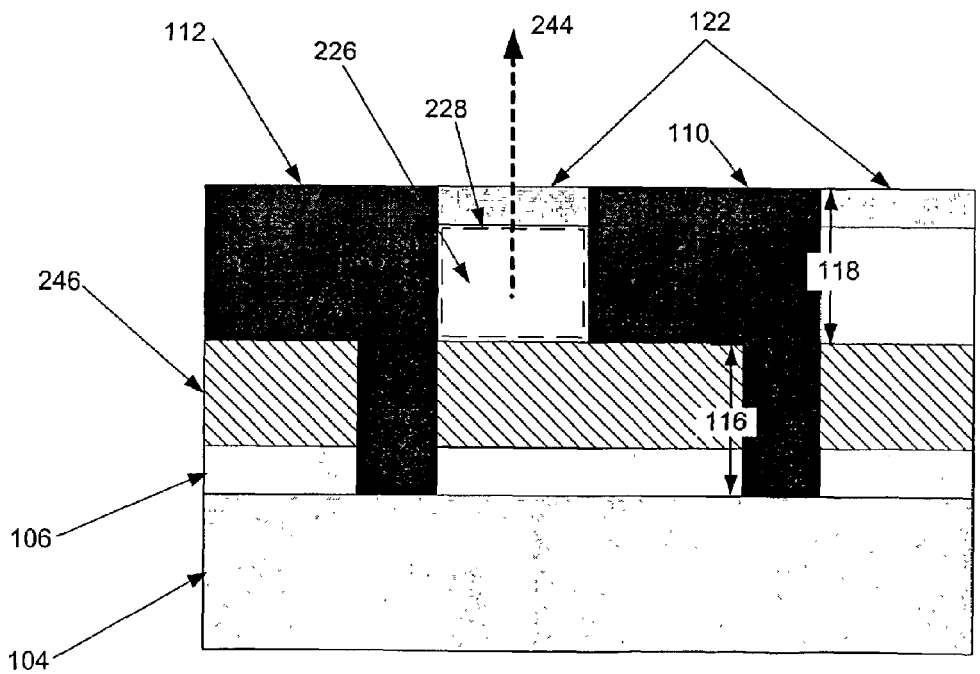

Referring to FIGS. 2A and 2B, an analog of the structure depicted in FIGS. 1A and 1B is depicted, the variation of FIG. 2 having substantially the same substrate layer (104), etch stop dielectric layer (106), conductive layers (110, 112), and permeable layer (122) as included in the structures of FIGS. 1A and 1B, and having a thinner sacrificial dielectric layer (208) which, in this embodiment, provides room for an additional dielectric layer (246) positioned between the etch stop dielectric layer (106) and both the conductive layers (110, 112) and the sacrificial dielectric layer (208), as shown in FIG. 2A. In a manner analogous to that of the structure of FIG. 1, the structure of FIG. 2A is converted to the structure of FIG. 2B by remote decomposition of at least a portion of the sacrificial dielectric layer (208) to form a sacrificial dielectric layer decomposition, and removal of a portion of the decomposition through the permeable layer (122) by diffusion along a diffusion pathway (244) away from the volume (228) now occupied by a dielectric layer defining one or more voids (226), which provide dielectric property advantages. In the depicted variation, the dielectric layer (246) comprises a dielectric material which is not removed during the transformation of the sacrificial dielectric layer (208), and is in this sense a "nonsacrificial" dielectric layer. Depending upon the mode of decomposition of the sacrificial dielectric layer (208), the nonsacrificial layer may, for example, be selected from dielectric materials having higher thermal decomposition temperatures than that of the material comprising the sacrificial dielectric layer (208), or lower chemical decomposition thresholds when placed in contact with chemical solvents, for example, which may be used to selectively chemically decompose the material comprising the sacrificial dielectric layer (208).

Suitable materials for the dielectric layer (246) include but are not limited to siloxane-based polymers, such as those sold under the trade names "LKD-5109™", "Nanoglass E™", and "Zirkon™", distributed by JSR Microelectronics Corporation, Honeywell Corporation, and Shipley Corporation, respectively; fluorinated silicate glass ("FSG"); porous and nonporous carbon doped oxide ("CDO"), having the molecular structure $Si_x O_y R_z$, in which "R" is an alkyl or aryl group, the CDO preferably comprising between about 5 and about 50 atom % carbon, and more preferably, about 15 atom % carbon; a CVD-deposited CDO sold under the trade name "Black Diamond™", distributed by Applied Materials Corporation; silicon dioxide; a spin-on low-k silicon dioxide variant sold under the trade name "FOx™", distributed by Dow Corning Corporation; a CVD-deposited CDO sold under the trade name "Coral™", distributed by Novellus Corporation; electron-beam-cured CVD-deposited CDO materials; and materials known as "zeolites", such as highly-ordered mesoporous silica and aluminosilicate.

Many other dielectric materials known in the art may be suitable to comprise the dielectric layer (246), as its main function besides low dielectric constant isolation is mechanical support for adjacent structures. Other suitable materials for the dielectric layer (246) include but are not limited to silicon dioxide (either undoped or doped with phosphorus or boron and phosphorus); silicon nitride; silicon oxy-nitride; porous oxide; an organic containing silicon oxide; or a polymer. Silicon dioxide, silicon nitride, and silicon oxy-nitride preferably have relatively high mechanical strength characteristics as compared with many suitable dielectric layer (246) materials. Also preferred are polymers or carbon doped oxides, as further described above, with a low dielectric constant: preferably less than about 3.5 and more preferably between about 1.5 and about 3.0.

Preferably, the material comprising the dielectric layer (246) has a thermal decomposition temperature higher than that of the associated sacrificial material should a thermal decomposition modality be envisioned; should a chemical decomposition modality be employed to facilitate removal of the sacrificial material, a material for the dielectric layer (246) is preferred which is not substantially decomposed with exposure to the pertinent chemical agents or solvents. In other words, the material comprising the dielectric layer (246) preferably does not substantially decompose during decomposing of the sacrificial dielectric layer (208). The dielectric layer (246) preferably has a thickness between about 100 nanometers and about 1,200 nanometers and is formed using conventional techniques appropriate for the selected material, such as spin-on, CVD, PECVD, evaporative deposition, and PVD.

In the depicted variation, the dielectric layer (246) is positioned adjacent the via portions (116) of the conductive layers and not adjacent to the line portions (118). Such a geometric configuration may be desirable because it provides support to the narrowed via portions (116), which may be more susceptible to undesirable bending or deformation due to their smaller relative size, while it also leaves the highly-conductive line portions (118) more likely surrounded by voids resulting from the decomposition and removal of a portion of the sacrificial dielectric layer (208).

Figure 3A:
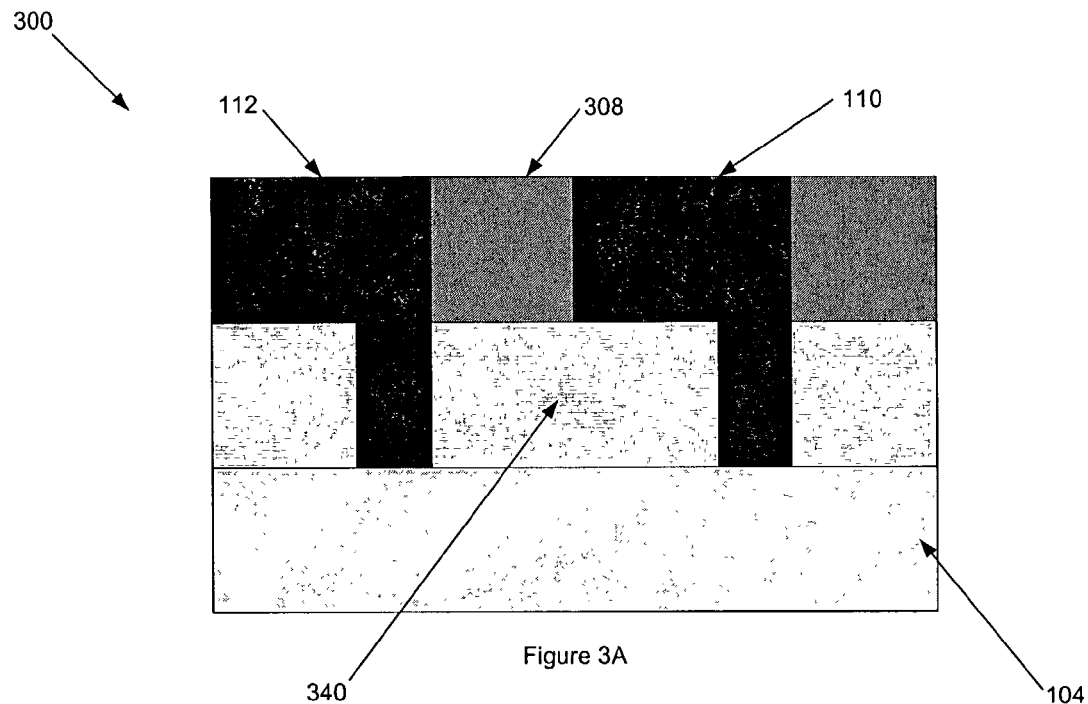
FIGS. 3A-3M depict cross-sectional views of various aspects of another embodiment of the present invention incorporating a permeable layer which functions as an inter-layer dielectric layer.
Figure 3B:
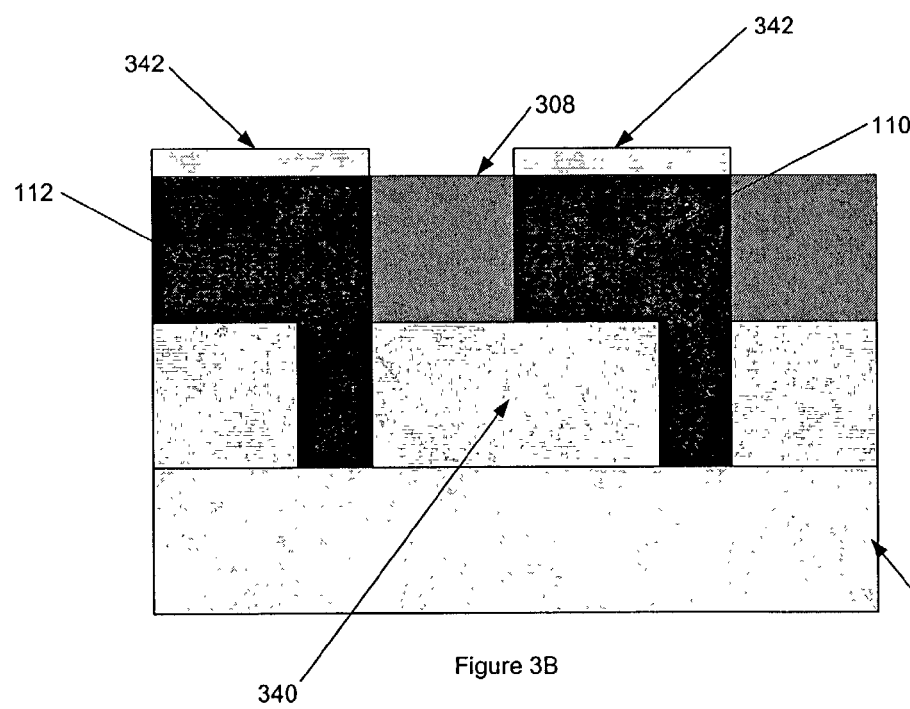
Figure 3C:
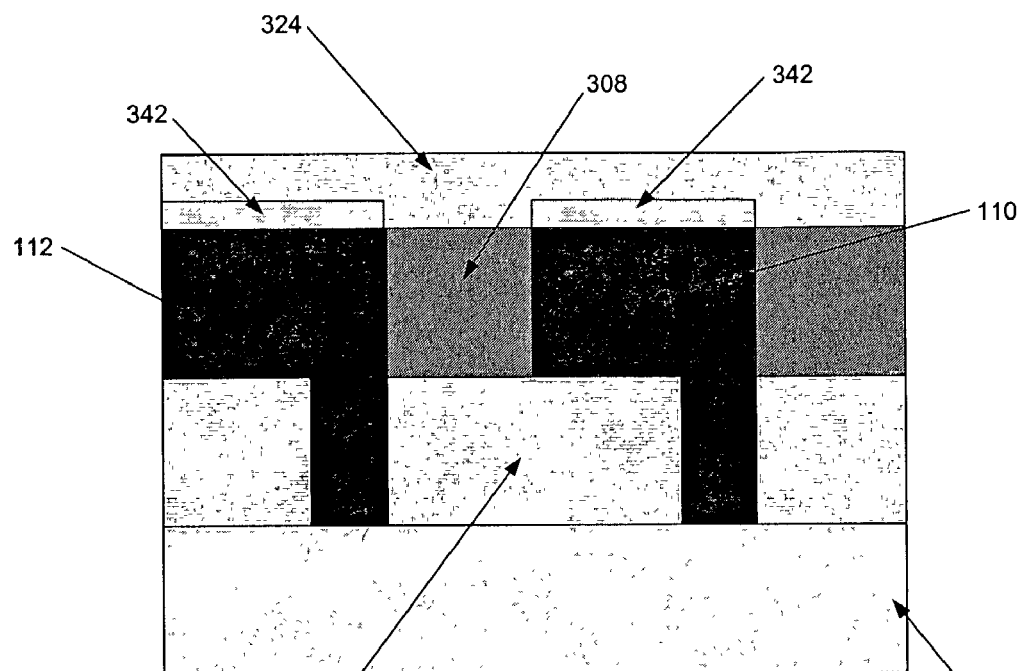
Figure 3D:
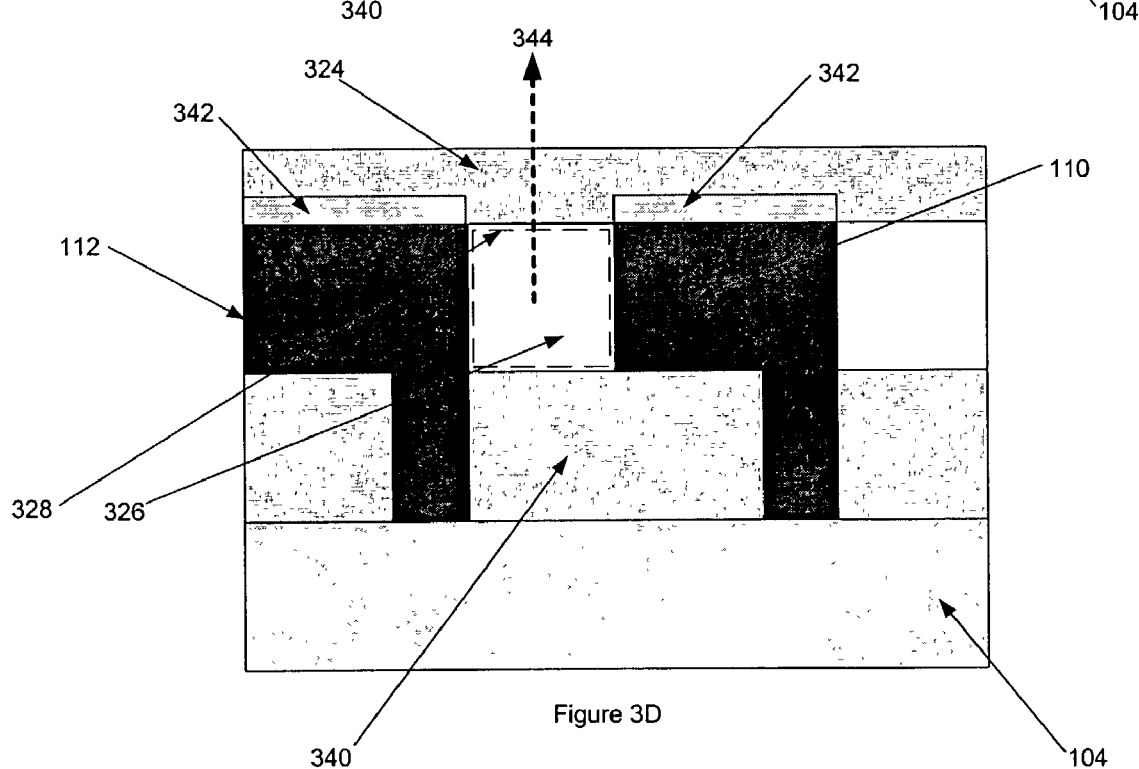
Figure 3E:
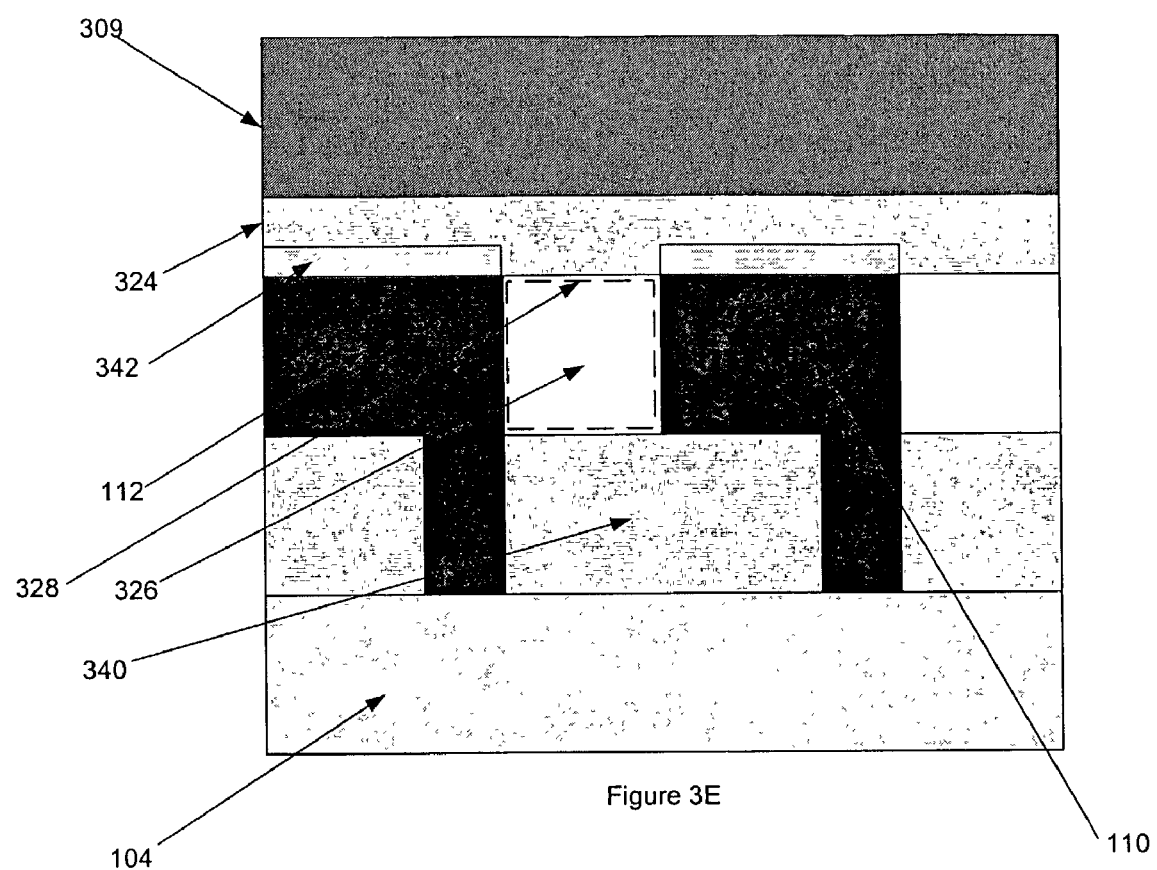
Figure 3F:
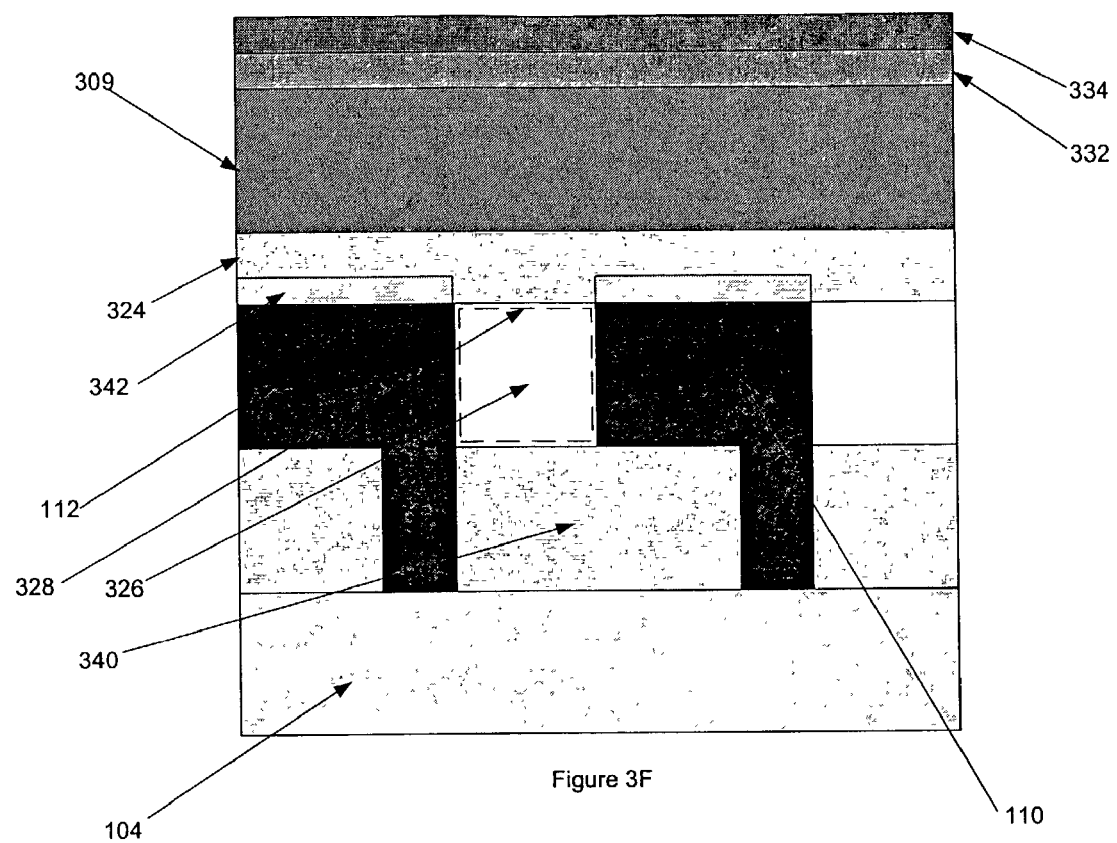
Figure 3G:
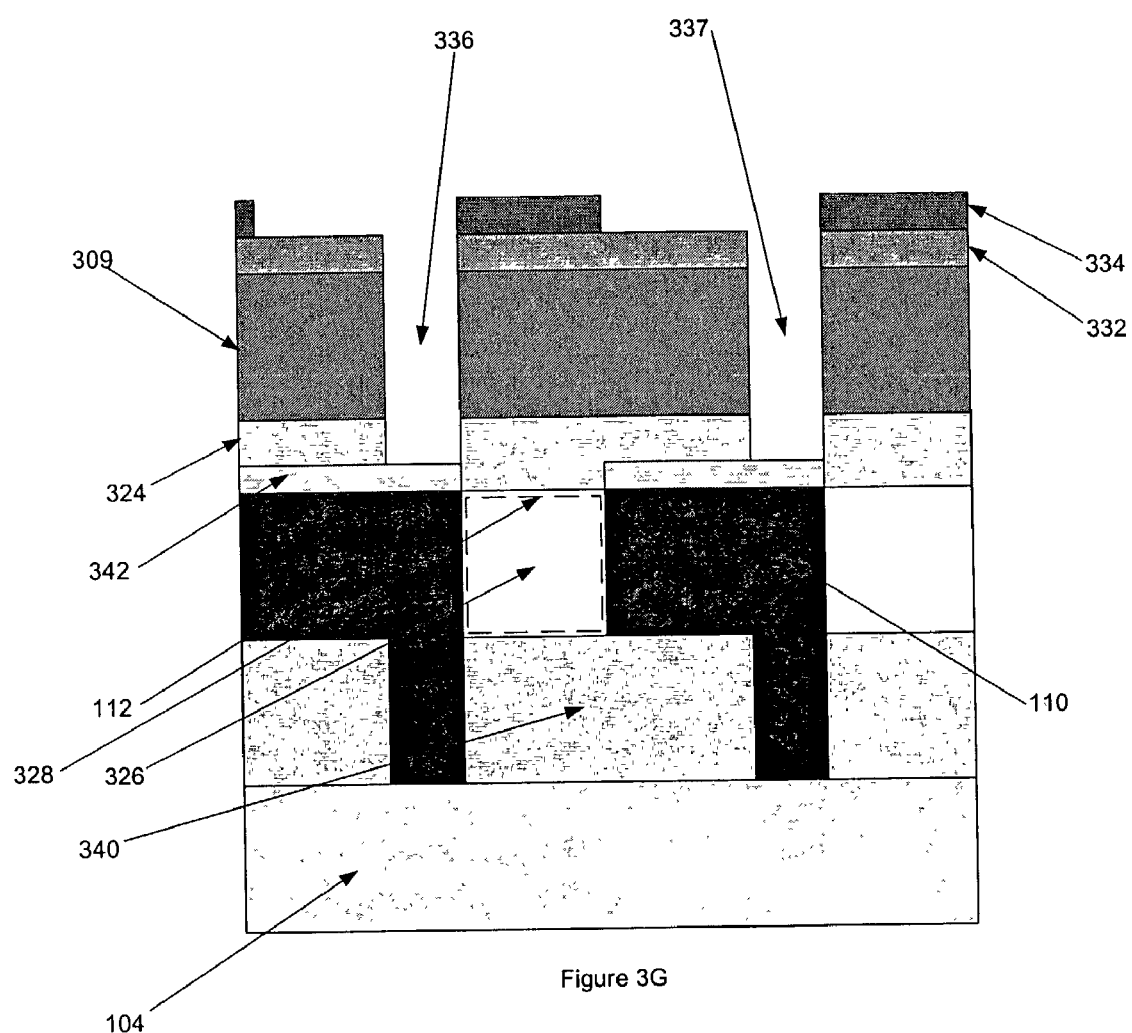
Figure 3H:
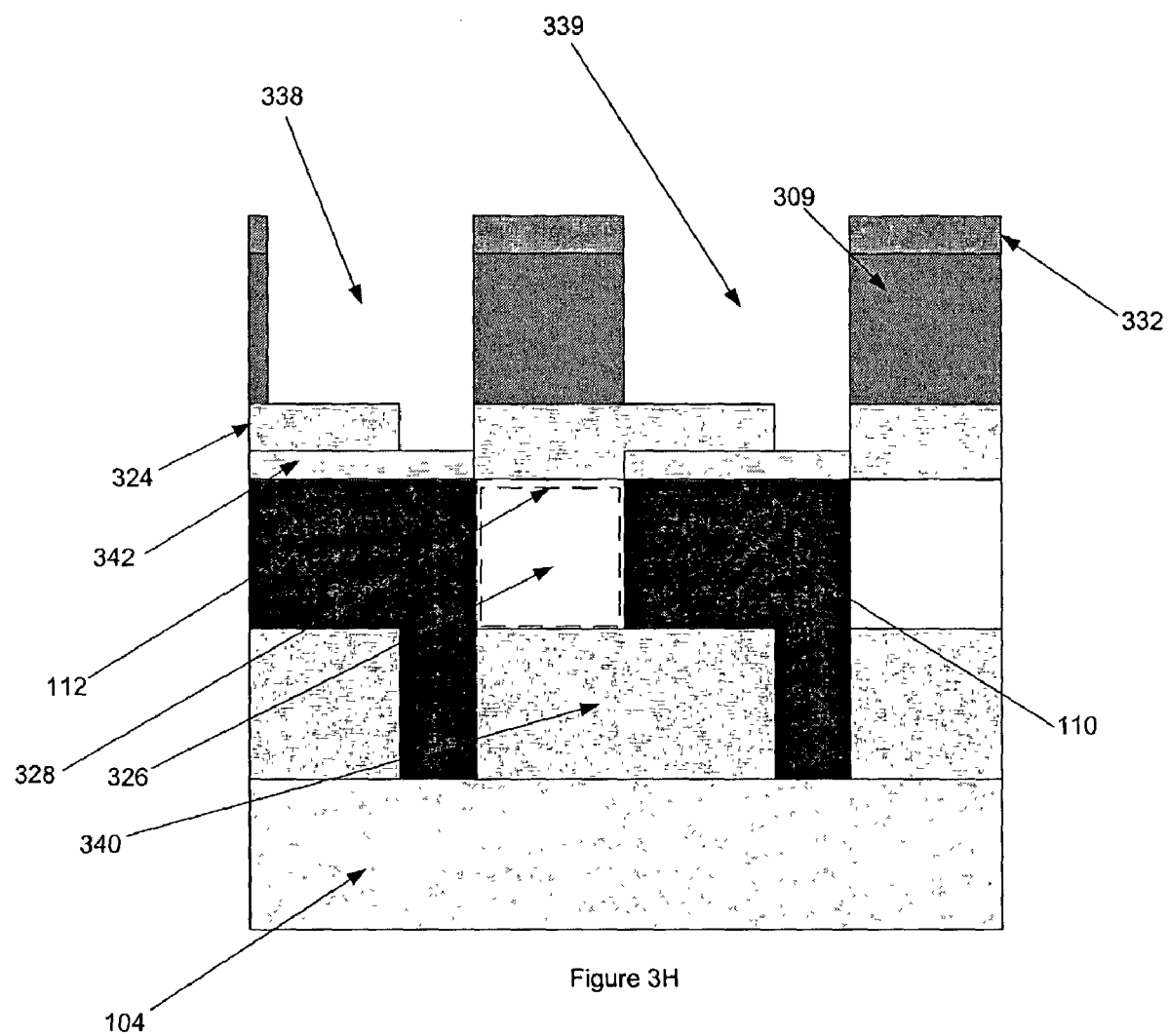
Figure 3I:
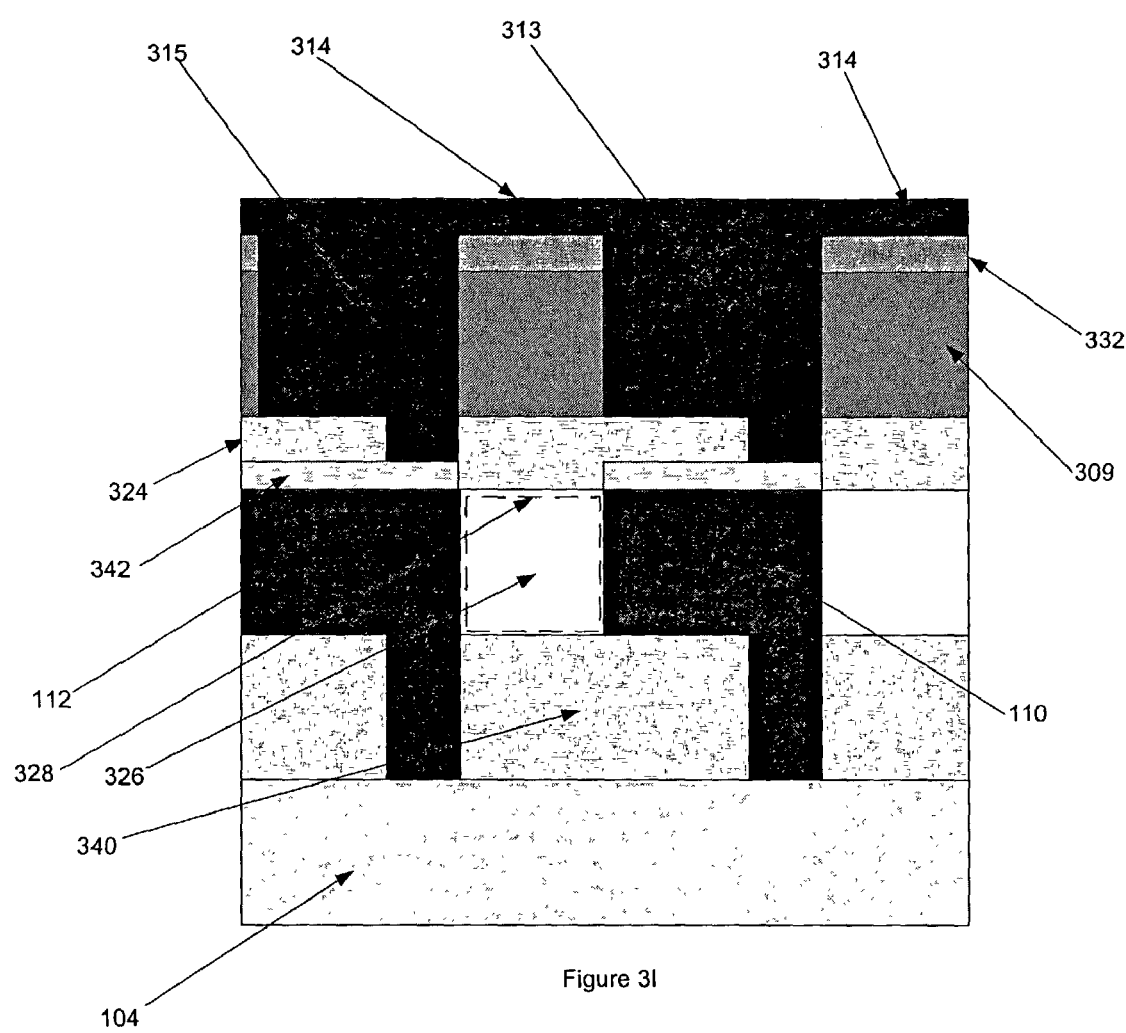
Figure 3J:
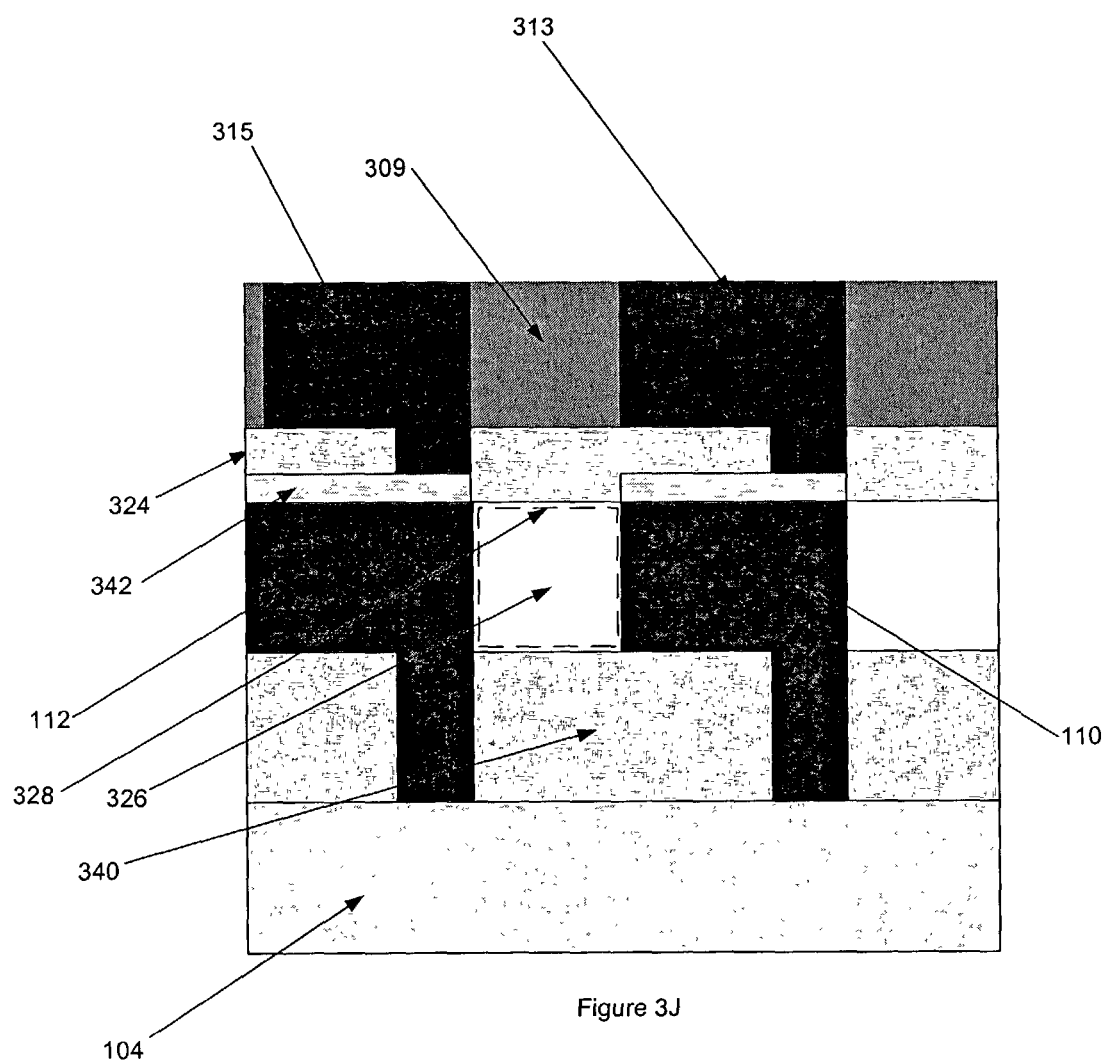

Referring to FIGS. 3A and 3J, another illustrative embodiment of the invention is depicted wherein the permeable layer (or layers), as first shown in FIG. 3C (324), are located not in conventional hard mask position, but in the position and function of a dielectric layer, and more specifically, an interlayer dielectric or "ILD" layer for a subsequently-formed interconnect layer. Following the manner in which FIGS. 1A-1B are used above to introduce concepts further described and expanded in FIGS. 1C-1J, FIGS. 3A-3D serve an analogous function for FIGS. 3E-3M, which build upon the concepts introduced with reference to FIGS. 3A-3D, once again illustrating how such embodiments may be integrated into more complex multi-layer embodiments of the invention, with previously formed permeable layers functioning as mechanical platforms to enable formation of subsequent layers in close proximity to voids resulting from removed sacrificial materials without mechanical failure.

Referring to FIG. 3A, a microelectronic structure (300) is depicted having a dielectric layer (340) disposed between a substrate layer (104) and a sacrificial dielectric layer (308), and two conductive layers (110, 112) positioned across the dielectric layer (340) and sacrificial dielectric layer (308). The substrate layer (104) may comprise similarly broad panoply of materials and compositions as has been described in reference to FIG. 1.

Depicted adjacent the substrate layer (104) is a dielectric layer (340), which in the depicted embodiment, comprises a nonsacrificial material relative to the sacrificial dielectric layer (308) to which it is adjacent, in that the dielectric layer (340) is selected to not substantially decompose during remote decomposition of the sacrificial dielectric layer (308), as described in further detail below. Depending upon the mode of decomposition of the sacrificial dielectric layer (308), the nonsacrificial dielectric layer (340) may, for example, be selected from dielectric materials having higher thermal decomposition temperatures than that of the material comprising the sacrificial dielectric layer (308), or lower chemical decomposition thresholds when placed in contact with chemical solvents, for example, which may be used to selectively chemically decompose the material comprising the sacrificial dielectric layer (208).

Depending upon process demands associated with the substrate layer (104), the dielectric layer (340) may comprise almost any dielectric material used to isolate conductive layers such as those depicted (110, 112). Suitable materials and formation techniques are discussed above in reference to the dielectric layer (246) of FIGS. 2A and 2B. As discussed below in reference to FIG. 3C, in embodiments wherein a portion of the inter-layer dielectric material must function as a permeable layer through which a sacrificial material decomposition shall be diffused, a more narrow selection of materials is required.

Preferably, the material comprising the dielectric layer (340) has a thermal decomposition temperature higher than that of the associated sacrificial material should a thermal decomposition modality be envisioned; should a chemical decomposition modality be employed to facilitate removal of the sacrificial material, a material for the dielectric layer (340) is preferred which is not substantially effected by exposure to the pertinent chemical agents or solvents. The dielectric layer (340) preferably has a thickness between about 100 nanometers and about 1,200 nanometers and is formed using conventional techniques for the selected materials, such as spin-on, CVD, PECVD, evaporative deposition, and PVD.

In the depicted variation, the dielectric layer (340) is positioned adjacent the via portions (316) of the conductive layers and not adjacent to the line portions (318). As with the dielectric structure of FIGS. 2A and 2B, such a geometric configuration may be desirable because it provides support to the narrowed via portions (316), which may be more susceptible to undesirable bending or deformation due to their smaller relative size, while it also leaves the highly-conductive line portions (318) more likely surrounded by voids resulting from the decomposition and removal of a portion of the sacrificial dielectric layer (308), as described below.

A sacrificial dielectric layer (308) is positioned adjacent the dielectric layer (340) and between the two depicted conductive layers (110, 112), as shown in FIG. 3A. The material comprising the sacrificial layer (308), like that of the previously described sacrificial layers (108, 208), is selected for not only dielectric properties, but also for relative decomposition threshold and diffusability through a permeable layer with which is paired. In other words, the material comprising the sacrificial layer (308) must have desirable dielectric performance, particularly if any significant portion of the layer (308) is to remain intact after some other portion of the layer (308) has been decomposed and removed; it must be selectively and remotely decomposable without substantial effect to surrounding structures, such as conductive layers (110, 112), shunt layers which may partially or completely encapsulate the conductive layers (342 of FIG. 3B, for example), the dielectric layer (340), and the permeable layer (324 of FIG. 3C, for example); and when decomposed, must be diffusible through and away from the permeable layer (324 of FIG. 3C, for example) material with which is structurally associated.

Suitable materials for the sacrificial dielectric layer (308) in the depicted embodiment include but are not limited to polynorbornene-based polymers, such as that sold under the trade name "Unity400™", distributed by Promerus LLC; polycyclohexene; the co-polymer of polypropylene oxide and polyethylene oxide; polystyrene; poly(p-phenylene); polyxylene; cross-linked polymethylmethacrylate ("PMMA"); polyarylene-based polymeric dielectrics such as that sold under the trade name "SiLK™", distributed by Dow Chemical Corporation; poly(aryl ether)-based polymeric dielectrics such as that sold under the trade name "FLARE™", distributed by Honeywell Corporation; and polyarylene-based spin-on dielectrics such as that sold under the trade name "GX-3™", also from Honeywell Corporation. Depending upon the material selected for this and other associated layers, the sacrificial dielectric layer (308) may be deposited using conventional techniques, such spin-on, CVD, PECVD, evaporative deposition, and PVD, to form a layer having a thickness preferably between about 100 nanometers and about 1,000 nanometers.

As with the conductive layers (110, 112) described in association with other embodiments, the conductive layers depicted in FIGS. 3A-3M may comprise material conventionally used to form conductive layers in integrated circuits, and preferably comprises metals such as copper, aluminum, and alloys thereof, formed using known techniques such as electroplating or CVD, or PVD.

Referring to FIG. 3B, a shunt layer (342) has been added adjacent each of the conductive layers (110, 112). A shunt layer (342) may be formed using conventional techniques and materials, to isolate material comprising the conductive layers (110, 112) from subsequent treatments and materials. With copper metal conductive layers, a metal shunt layer comprising, for example, cobalt or tungsten, is effective for isolating the copper. The shunt material preferably may be deposited using conventional selective techniques such as electroless or flash deposition to form a shunt layer (342) having a thickness preferably between about 5 nanometers and about 100 nanometers. Deposition of the shunt material may follow a planarization using known techniques such as chemical-mechanical planarization. As would be apparent to one skilled in the art, the selectivity of the preferred shunt deposition procedures generally obviates the need for additional planarization or etch back to remove shunt material from dielectric materials adjacent the conductive layers.

Figure 3K:
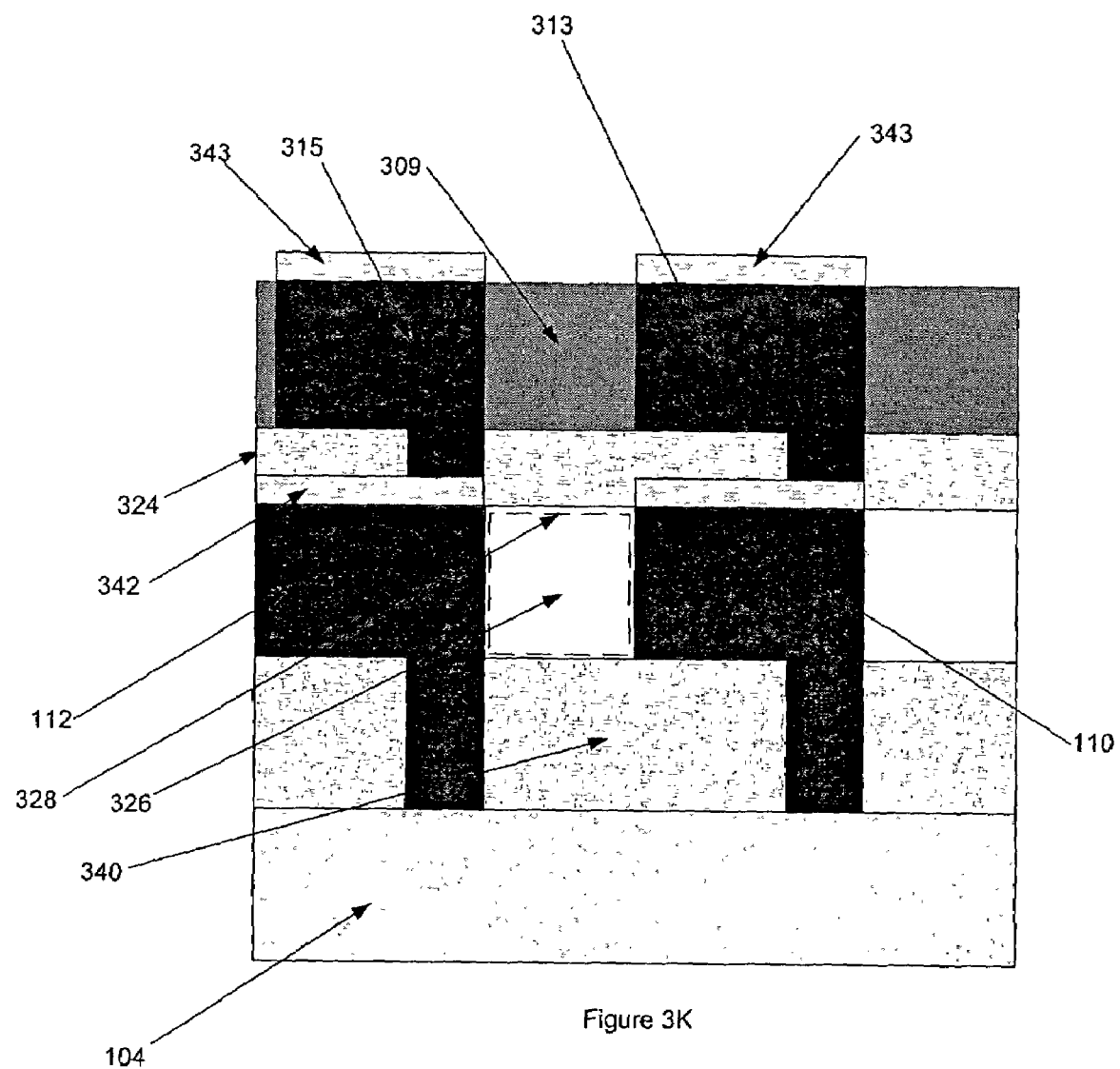

Referring to FIG. 3C, a permeable layer (324) is shown, formed adjacent the exposed shunt layer (324) and sacrificial dielectric layer (308) surfaces. In this embodiment, the conductive layers (110, 112), in place before the permeable layer (324), are not formed across the permeable layer (324). The positioning of the permeable layer (324) over the existing depicted topology may be known as "blanket" deposition due to the nature of the layer "blanket" covering, or substantially fully covering, surfaces of structures which may not be in the same plane, as a traditional blanket would when positioned over physical topology. Given the inter-layer dielectric position of the permeable layer (324) as shown in FIGS. 3J and 3K, for example, the material comprising it preferably has a low dielectric constant. In addition, such material is selected and paired with a sacrificial material to enable remote decomposability via either thermal or chemical means, and removal of a decomposition of sacrificial material by diffusion through the permeable layer (324). Further, since the permeable layer (324) remains intact subsequent to removal of sacrificial material, materials providing added mechanical integrity to the integration are preferred.

Suitable materials for the permeable layer (324) include but are not limited to porous materials such as siloxane-based polymers, sold under trade names such as "LKD-5109™", distributed by JSR Microelectronics Corporation, "Nanoglass E™", distributed by Honeywell Corporation, "Zirkon™", distributed by Shipley Corporation, and "MesoELK™", distributed by Air Products Corporation; and porous carbon doped oxide ("CDO"), having the molecular structure $Si_x O_y R_z$, in which "R" is an alkyl or aryl group, the CDO preferably comprising between about 5 and about 50 atom % carbon, and more preferably, about 15 atom % carbon. Such materials form porous permeable layers having pores with average diameters between about 5 angstroms and about 20 angstroms, the term "average diameter", conventionally calculated as twice the cube root of (0.75*actual pore volume/pi), being in reference to the fact that the pores generally are not perfectly spherical in shape. Low density materials such as electron-beam-cured CVD-deposited carbon doped oxides, also are suitable. Each of the aforementioned porous and/or low-density materials has relatively high thermal decomposition temperature, over 500 degrees Celsius. Depending upon the materials selected for the permeable layer (324) and other associated layers, such as the conductive layers (313, 315), the permeable layer (324) may be deposited using conventional techniques, such as spin-on, CVD, PECVD, evaporative deposition, and PVD, to form a layer preferably having a thickness between about 100 nanometers and about 500 nanometers.

In an analogous fashion to that described in reference to FIGS. 1A and 1B, and 2A and 2B, the structure depicted in FIG. 3C may be transformed into the structure of FIG. 3D by remote decomposition of at least a portion of the sacrificial dielectric layer (308) using, for example, chemical or thermal means, and subsequent removal of the sacrificial dielectric decomposition by diffusion of the decomposition through the permeable layer (324) along a diffusion pathway (344), as shown in FIG. 3B, leaving behind one or more voids (326) in the volume (324) previously occupied by the intact sacrificial dielectric layer (308 of FIG. 3A) which may have both preferred dielectric properties and structural integrity. The voids preferably occupy more than about 70% of the volume previously occupied by the intact sacrificial dielectric layer.

Preferred pairings of permeable and sacrificial materials include but are not limited to: a polynorbornene-based polymer dielectric sacrificial material with a porous siloxane-based polymer permeable layer, wherein the polynorbornene-based polymer dielectric material is thermally decomposed at a temperature of between about 400 and about 425 degrees Celsius, without thermally decomposing the siloxane-based polymer permeable layer, which has a thermal decomposition temperature over 500 degrees Celsius; and a polycyclohexene-based polymer sacrificial dielectric material with a porous carbon doped oxide permeable layer, wherein the polycyclohexene-based sacrificial dielectric material is thermally decomposed at a temperature of between about 400 and about 425 degrees Celsius, without thermally decomposing the porous carbon doped oxide permeable layer, which has a thermal decomposition temperature over 500 degrees Celsius.

The structures, methods, and materials associated with the illustrated embodiments of FIGS. 3A-3D are further described in the multiple-layer example depicted in FIGS. 3E-3M which builds upon the structure depicted in FIG. 3D using similar layers and materials, and thus serves to not only further describe single-interconnect-layer embodiments such as that depicted in FIGS. 3A-3D, but also to describe how such embodiments may be integrated into more complex multi-layer embodiments of the invention.

Referring to FIG. 3E, an additional sacrificial dielectric layer (309) has been deposited adjacent the permeable layer (324) following the transformation to the structure of FIG. 3D. The material comprising the sacrificial dielectric layer (309) may be comprised of similar materials to those comprising the previous sacrificial layer (308), and may be deposited using conventional techniques such as spin on or known vapor deposition variations at thicknesses preferably between about 10 nanometers and 200 nanometers. Referring to FIG. 3F, two additional layers have been formed adjacent the sacrificial dielectric layer (309), one being a first hard mask layer (332), the other being a second hard mask layer (334), the two hard mask layers enabling conventional multiphase lithography, as is illustrated in FIGS. 3G and 3H. Dual layer hard masking is well known in the art of dual damascene interconnect formation, and conventional pairings of materials for the two hard mask layers (332, 334), which generally have different etch selectivities relative to each other, may be employed.

Referring to FIG. 3G, trenches (336, 337) are formed substantially perpendicularly to the orientation of the plane of the substrate layer (104) using patterning followed by etching to the shunt layer (342), resulting in trenches (336, 337). Referring to FIG. 3H, subsequent to removal of the second hard mask layer (334) using conventional techniques, the trenches are enlarged with further etching to form enlarged trenches (338, 339) to define the shape of subsequently-formed conductive layers, as shown in FIG. 3I, with a width preferably between 10 nanometers and 1,000 nanometers.

Referring to FIG. 3I, conductive layers are formed, preferably using similar materials and process technologies as described in reference to FIG. 1H. Barrier layers (not shown) may also be added to isolate the selected conductive material, as further described in reference to FIG. 1H. As shown in FIG. 3I, conductive layer formation may result in conductive material portions (314) extending beyond the main body of the conductive layers (313, 315) as defined by the previously formed enlarged trenches (338 and 339 of FIG. 3H). Referring to FIG. 3J, such extending portions have been removed using standard techniques such as CMP or etch back.

Figure 3L:
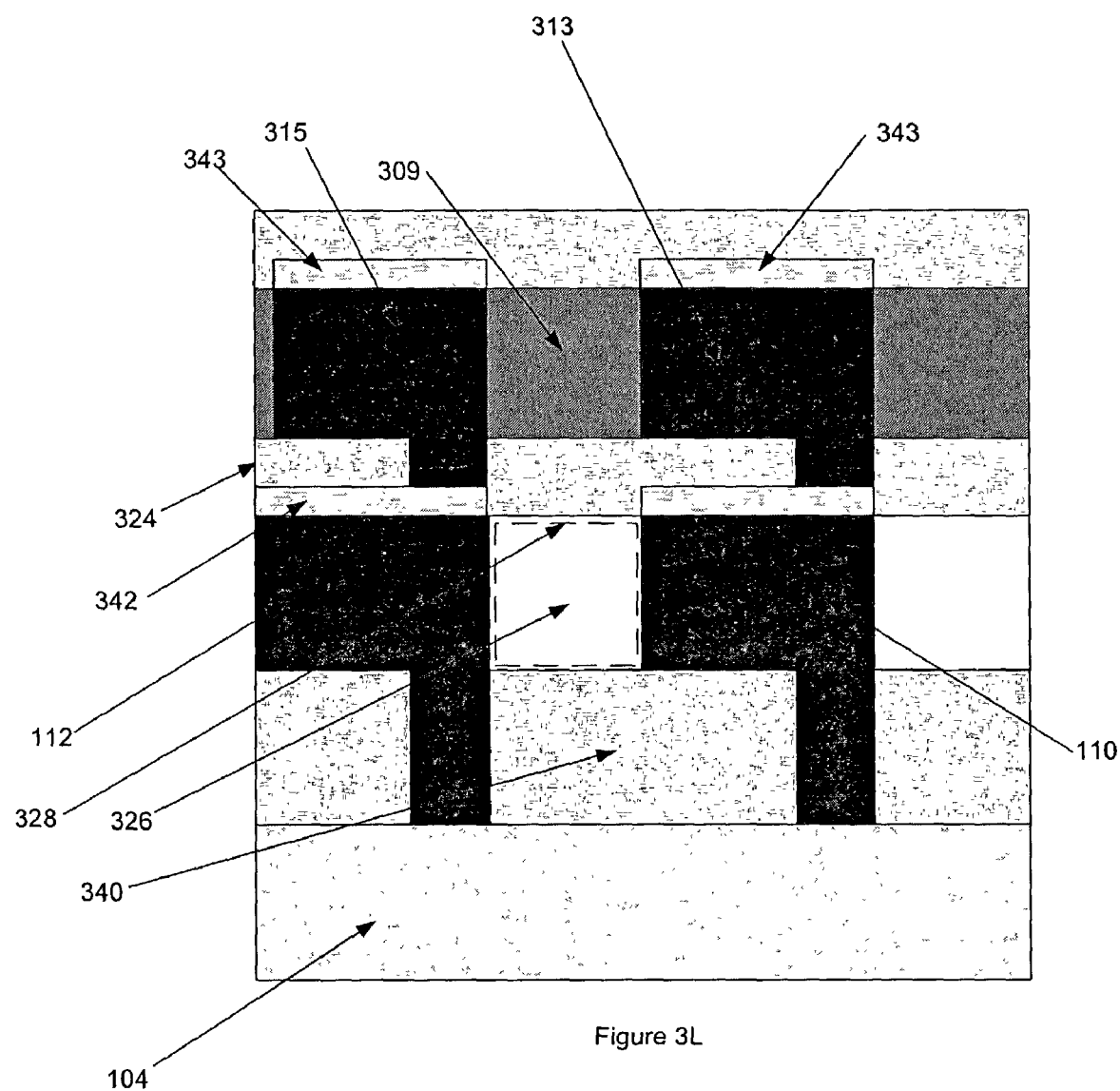
Figure 3M:
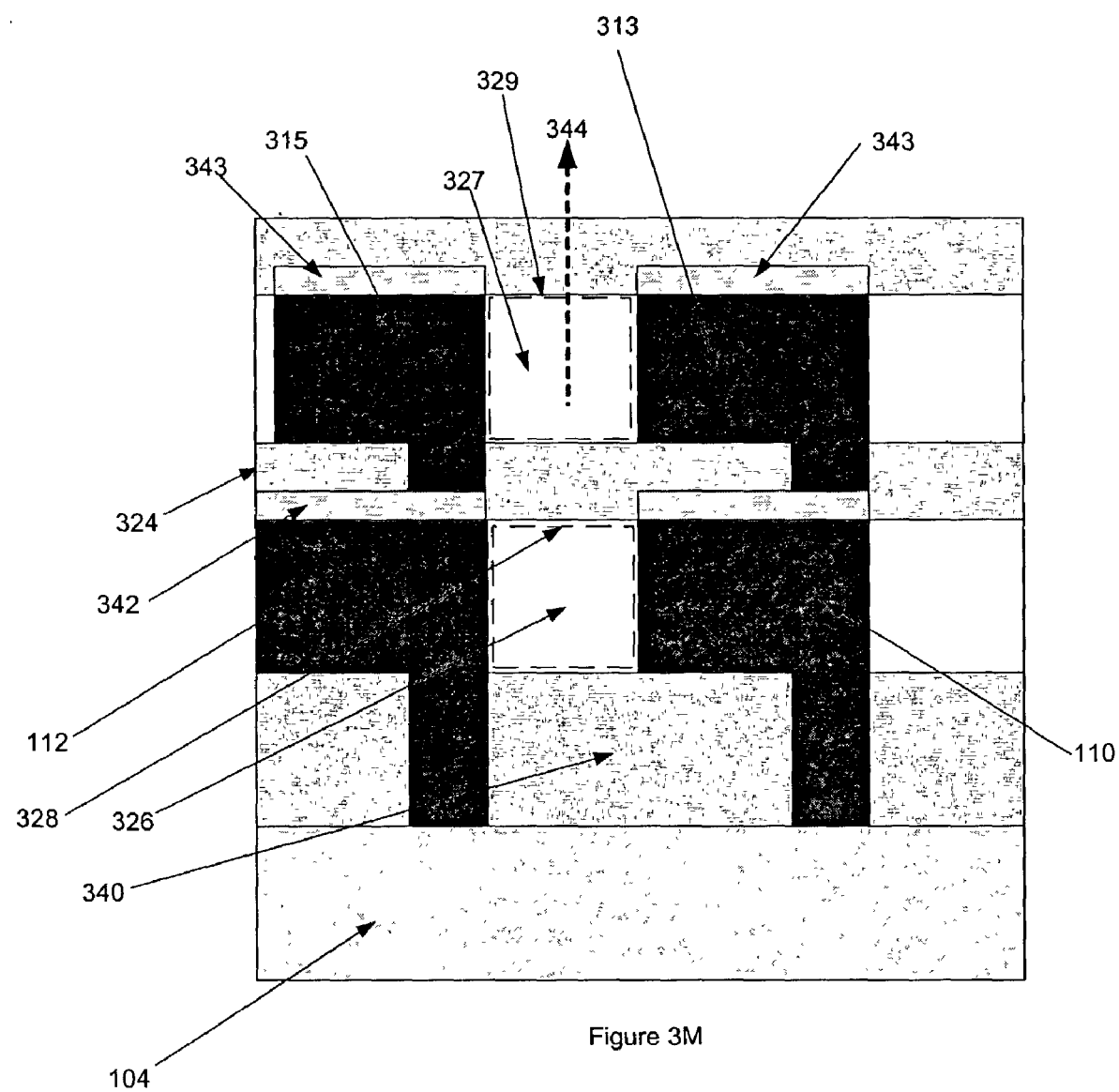

Referring to FIG. 3K, a shunt layer (343) is formed adjacent the conductive layers (313, 315), as described in reference to analogous structures of FIG. 3B. Subsequently, a permeable layer (325) is blanket deposited adjacent the exposed portions of the shunt layer (343) and sacrificial dielectric layer (309), as shown in FIG. 3L, the materials comprising the permeable layer (325) being appropriately paired with those of the sacrificial dielectric layer (309) for decomposition and removal of at least a portion of the sacrificial dielectric material, as discussed above. As discussed in reference to FIG. 3C, in this embodiment, the conductive layers (313, 315), in place before the permeable layer (325), are not formed across the permeable layer (325). Finally, in reference to FIG. 3M, a transformation has been made due to the selective remote decomposition of at least a portion of the sacrificial dielectric layer (309 of FIG. 3K) and diffusion of such decomposition through the permeable layer (325) to leave behind one or more voids (327) in the volume previously occupied (329) by the intact sacrificial layer (309 of FIG. 3K), the voids preferably occupying more than about 70% of the volume previously occupied by the intact sacrificial layer.

Thus, a novel solution for low-k structure and formation thereof is disclosed. Although the invention is described herein with reference to specific embodiments, many modifications therein will readily occur to those of ordinary skill in the art. Accordingly, all such variations and modifications are included within the intended scope of the invention as defined by the following claims.

The invention claimed is:

1. A microelectronic structure comprising:
   a first conductive interconnect layer having a line portion and a via portion disposed on a second conductive interconnect layer that underlies the first conductive interconnect layer;
   a first permeable layer adjacent to the entirety of the via portion of the first conductive interconnect layer;

a sacrificial dielectric layer including a polycyclohexene based polymer disposed on the first permeable layer and adjacent to the entirety of the line portion of the first conductive interconnect layer;

a second permeable layer on the sacrificial dielectric layer; and a shunt disposed on a surface of the line portion of the first conductive interconnect layer, wherein the second permeable layer is permeable to a decomposition comprising a portion of the sacrificial dielectric layer.

2. The microelectronic structure of claim 1 wherein the shunt is disposed on the top surface of the first conductive interconnect layer.

3. The microelectronic structure of claim 2 wherein the shunt substantially covers only the top surface of the first conductive interconnect layer.

4. The microelectronic structure of claim 1 wherein the shunt comprises a metal.

5. The microelectronic structure of claim 4 wherein the shunt comprises at least one of cobalt or tungsten.

6. The microelectronic structure of claim 1 wherein the second permeable layer substantially covers the first conductive interconnect layer and the shunt.

7. The microelectronic structure of claim 1 wherein the second permeable layer comprises a porous carbon-doped oxide.

8. A microelectronic structure comprising:
a first conductive interconnect layer having a line portion and a via portion disposed on an second conductive interconnect layer that underlies the first conductive interconnect layer;

a first permeable layer adjacent to the entirety of the via portion of the first conductive interconnect layer;

a sacrificial dielectric layer including a polycyclohexene based polymer disposed on the first permeable layer and adjacent to the entirety of the line portion of the first conductive interconnect layer; and a second permeable layer on the sacrificial dielectric layer, wherein the second permeable layer is permeable to a decomposition comprising a portion of the sacrificial dielectric layer.

9. The microelectronic structure of claim 8, wherein the second conductive interconnect layer has a line portion and a via portion, and further comprising:

an air gap adjacent to the line portion of the second conductive interconnect layer and below the first permeable layer.

10. The microelectronic structure of claim 9, further comprising:

a dielectric layer adjacent to the entirety of the via portion of the second conductive interconnect layer.

11. The microelectronic structure of claim 8, further comprising:

a shunt layer on a top surface of the line portion of the first conductive interconnect layer.

12. The microelectronic structure of claim 8, wherein the second permeable layer comprises a porous carbon-doped oxide.

13. The microelectronic structure of claim 8, wherein the second permeable layer is over the sacrificial dielectric layer and the first conductive interconnect layer as a blanket layer.

* * * * *